United States Patent
Stowell et al.

(10) Patent No.: US 10,937,632 B2
(45) Date of Patent: *Mar. 2, 2021

(54) MICROWAVE CHEMICAL PROCESSING REACTOR

(71) Applicant: Lyten, Inc., Sunnyvale, CA (US)

(72) Inventors: Michael W. Stowell, Sunnyvale, CA (US); Bryce H. Anzelmo, Mountain View, CA (US); Thomas Riso, Elizabeth, CO (US)

(73) Assignee: LytEn, Inc., San Jose, CA (US)

( * ) Notice: Subject to any disclaimer, the term of this patent is extended or adjusted under 35 U.S.C. 154(b) by 453 days.

This patent is subject to a terminal disclaimer.

(21) Appl. No.: 15/676,649

(22) Filed: Aug. 14, 2017

(65) Prior Publication Data

US 2018/0226229 A1 Aug. 9, 2018

Related U.S. Application Data

(63) Continuation of application No. 15/428,474, filed on Feb. 9, 2017, now Pat. No. 9,767,992.

(51) Int. Cl.
*H01J 37/32* (2006.01)

(52) U.S. Cl.
CPC .... *H01J 37/32192* (2013.01); *H01J 37/3244* (2013.01); *H01J 37/32229* (2013.01); *H01J 37/32532* (2013.01); *H01J 2237/334* (2013.01)

(58) Field of Classification Search
USPC .......... 118/723 MW, 723 ME, 723 MR, 118/723 MA; 156/345.41, 345.35, 345.42
See application file for complete search history.

(56) References Cited

U.S. PATENT DOCUMENTS

| | | |
|---|---|---|
| 3,706,445 A | 12/1972 | Gentry |
| 5,324,553 A | 6/1994 | Ovshinsky et al. |

(Continued)

FOREIGN PATENT DOCUMENTS

| | | |
|---|---|---|
| CN | 105870419 A | 8/2016 |
| CN | 106398802 A | 2/2017 |

(Continued)

OTHER PUBLICATIONS

Notice of Allowance dated Oct. 11, 2018 for U.S. Appl. No. 15/725,928.

(Continued)

*Primary Examiner* — Rakesh K Dhingra
(74) *Attorney, Agent, or Firm* — Paradice & Li LLP

(57) ABSTRACT

A processing reactor includes a microwave energy source and a field-enhancing waveguide. The field-enhancing waveguide has a field-enhancing zone between a first cross-sectional area and a second cross-sectional area of the waveguide, and also has a plasma zone and a reaction zone. The second cross-sectional area is smaller than the first cross-sectional area, is farther away from the microwave energy source than the first cross-sectional area, and extends along a reaction length of the field-enhancing waveguide. The supply gas inlet is upstream of the reaction zone. In the reaction zone, a majority of the supply gas flow is parallel to the direction of the microwave energy propagation. A supply gas is used to generate a plasma in the plasma zone to convert a process input material into separated components in the reaction zone at a pressure of at least 0.1 atmosphere.

16 Claims, 15 Drawing Sheets

(56) References Cited

U.S. PATENT DOCUMENTS

| | | | |
|---|---|---|---|
| 5,515,011 A | 5/1996 | Pasco | |
| 5,556,475 A | 9/1996 | Besen et al. | |
| 5,572,866 A | 11/1996 | Loving | |
| 5,693,173 A | 12/1997 | Colombo et al. | |
| 5,793,013 A * | 8/1998 | Read | H05H 1/30 118/723 MW |
| 5,874,705 A | 2/1999 | Duan | |
| 6,120,741 A | 9/2000 | Jacquault et al. | |
| 6,156,114 A | 12/2000 | Bell et al. | |
| 6,224,736 B1 | 5/2001 | Miyamoto | |
| 6,340,912 B1 | 1/2002 | Gerstenberg et al. | |
| 6,383,301 B1 | 5/2002 | Bell et al. | |
| 6,582,778 B2 | 6/2003 | Namiki et al. | |
| 6,805,779 B2 | 10/2004 | Chistyakov | |
| 6,914,556 B1 | 7/2005 | Nyswander | |
| 6,916,400 B2 | 7/2005 | Moisan et al. | |
| 7,022,149 B2 | 4/2006 | Krause et al. | |
| 7,102,110 B2 | 9/2006 | Shinohara | |
| 7,608,798 B2 | 10/2009 | Kumar et al. | |
| 7,799,119 B2 | 9/2010 | Zakrzewski et al. | |
| 7,875,322 B2 | 1/2011 | Kobayashi et al. | |
| 8,034,321 B2 | 10/2011 | Mauthner et al. | |
| 8,075,869 B2 | 12/2011 | Zhu et al. | |
| 8,222,579 B2 | 7/2012 | Taguchi et al. | |
| 8,337,764 B2 | 12/2012 | Yang et al. | |
| 8,475,760 B2 | 7/2013 | Rajala et al. | |
| 8,603,402 B2 | 12/2013 | Chang et al. | |
| 8,636,960 B2 | 1/2014 | Spitzl et al. | |
| 8,808,507 B2 | 8/2014 | Kasin | |
| 8,933,629 B2 | 1/2015 | Heil et al. | |
| 8,968,588 B2 | 3/2015 | Zhao et al. | |
| 9,051,185 B2 | 6/2015 | Levendis et al. | |
| 9,156,699 B2 | 10/2015 | Yamada et al. | |
| 9,293,302 B2 | 3/2016 | Risby et al. | |
| 9,767,992 B1 | 9/2017 | Stowell | |
| 9,862,602 B1 | 1/2018 | Riso et al. | |
| 9,862,606 B1 | 1/2018 | Cook et al. | |
| 2002/0050323 A1 | 5/2002 | Moisan et al. | |
| 2002/0144785 A1 * | 10/2002 | Srivastava | H01J 37/321 156/345.35 |
| 2003/0086859 A1 | 5/2003 | Kawakami et al. | |
| 2003/0138365 A1 | 7/2003 | Obidniak et al. | |
| 2004/0029339 A1 | 2/2004 | Yamamoto et al. | |
| 2004/0245088 A1 | 12/2004 | Gardner | |
| 2004/0265211 A1 | 12/2004 | Dillon et al. | |
| 2005/0003247 A1 | 1/2005 | Pham | |
| 2005/0089684 A1 | 4/2005 | Barron et al. | |
| 2005/0123467 A1 | 6/2005 | Harutyunyan | |
| 2005/0253529 A1 | 11/2005 | Kumar et al. | |
| 2007/0176709 A1 * | 8/2007 | Oksuz | H01J 37/32192 333/109 |
| 2007/0212254 A1 | 9/2007 | Nagatsu | |
| 2007/0243713 A1 * | 10/2007 | Charatan | H01J 37/32192 438/706 |
| 2007/0274893 A1 * | 11/2007 | Wright | H01J 37/32192 423/449.1 |
| 2008/0029030 A1 | 2/2008 | Goto et al. | |
| 2009/0060805 A1 | 3/2009 | Muradov et al. | |
| 2009/0194528 A1 | 8/2009 | Kotzian et al. | |
| 2009/0196801 A1 | 8/2009 | Mills | |
| 2009/0220767 A1 | 9/2009 | Schlogl et al. | |
| 2010/0036023 A1 | 2/2010 | Weng et al. | |
| 2010/0056819 A1 | 3/2010 | Jang et al. | |
| 2011/0005454 A1 * | 1/2011 | Schreck | H01J 37/32018 117/103 |
| 2011/0033639 A1 | 2/2011 | Coll et al. | |
| 2011/0059006 A1 | 3/2011 | Donnet et al. | |
| 2011/0206946 A1 | 8/2011 | Schmidt et al. | |
| 2012/0058397 A1 | 3/2012 | Zhamu et al. | |
| 2012/0094175 A1 | 4/2012 | Sheem et al. | |
| 2012/0258374 A1 | 10/2012 | Raston et al. | |
| 2013/0020939 A1 * | 1/2013 | Kim | H01P 3/123 315/111.41 |
| 2013/0084408 A1 * | 4/2013 | Nakao | H01J 37/32229 427/569 |
| 2013/0136684 A1 | 5/2013 | Wu et al. | |
| 2013/0150516 A1 | 6/2013 | Lettow | |
| 2013/0248773 A1 | 9/2013 | Chang et al. | |
| 2013/0270110 A1 | 10/2013 | Sasai et al. | |
| 2013/0296479 A1 | 11/2013 | Martin et al. | |
| 2013/0310495 A1 | 11/2013 | Kim et al. | |
| 2014/0008326 A1 * | 1/2014 | Toyoda | H05H 1/46 216/69 |
| 2014/0030181 A1 | 1/2014 | Liu et al. | |
| 2014/0159572 A1 | 6/2014 | Risby et al. | |
| 2014/0208638 A1 | 7/2014 | Thorre et al. | |
| 2014/0251955 A1 | 9/2014 | Itoh et al. | |
| 2014/0263202 A1 | 9/2014 | Partridge | |
| 2014/0313636 A1 | 10/2014 | Tour et al. | |
| 2014/0353207 A1 | 12/2014 | Strohm et al. | |
| 2015/0044565 A1 | 2/2015 | Wang et al. | |
| 2015/0073072 A1 | 3/2015 | Kim et al. | |
| 2015/0179294 A1 | 6/2015 | Kim et al. | |
| 2015/0246813 A1 | 9/2015 | Koveal et al. | |
| 2015/0267063 A1 | 9/2015 | Drewer et al. | |
| 2016/0059197 A1 | 3/2016 | Stevanovic et al. | |
| 2016/0185603 A1 | 6/2016 | Bozalina et al. | |
| 2016/0276055 A1 | 9/2016 | Choi et al. | |
| 2016/0340495 A1 | 11/2016 | Pan et al. | |
| 2017/0174520 A1 | 6/2017 | Walters et al. | |
| 2018/0099871 A1 | 4/2018 | Tanner et al. | |
| 2018/0327611 A1 | 11/2018 | Scheller et al. | |

FOREIGN PATENT DOCUMENTS

| | | |
|---|---|---|
| EP | 0184475 B1 | 5/1989 |
| EP | 1502486 B1 | 11/2011 |
| EP | 2702839 B1 | 3/2015 |
| JP | 2000150195 A | 5/2000 |
| JP | 2001122690 A | 5/2001 |
| JP | 2004346385 A | 12/2004 |
| WO | 1999012184 A2 | 3/1999 |
| WO | 2001009031 A1 | 2/2001 |
| WO | 2004092058 A2 | 10/2004 |
| WO | 2010094969 A1 | 8/2010 |
| WO | 2014090992 A3 | 8/2014 |
| WO | 2015189643 A1 | 12/2015 |
| WO | 2015193155 A1 | 12/2015 |
| WO | 2016001476 A1 | 1/2016 |
| WO | 2016135328 A1 | 9/2016 |

OTHER PUBLICATIONS

Office Action dated Nov. 1, 2018 for U.S. Appl. No. 15/918,422.
Office Action dated Sep. 20, 2018 for U.S. Appl. No. 16/003,680.
Notice of Allowance dated Mar. 16, 2018 for U.S. Appl. No. 15/711,620.
International Search Report dated Aug. 23, 2018 for PCT Patent Application No. PCT/US2018/015674.
International Search Report dated Jul. 9, 2018 for PCT Patent Application No. PCT/US2018/022420.
International Search Report dated Jun. 25, 2018 for PCT Patent Application No. PCT/US2018/022072.
International Search Report dated Jun. 27, 2018 for PCT Patent Application No. PCT/US2018/015671.
International Search Report dated Jun. 28, 2018 for PCT Patent Application No. PCT/US2018/020963.
International Search Report and Written Opinion dated Feb. 9, 2018 for PCT Application No. PCT/US2017/057892.
International Search Report dated Jan. 24, 2018 for PCT Patent Application No. PCT/US2017/055337.
Office Action dated Dec. 28, 2017 for U.S. Appl. No. 15/725,928.
Office Action dated Nov. 29, 2017 for U.S. Appl. No. 15/711,620.
"Pyrolytic Carbon," Biomedical Engineering Desk Reference, Oxford, UK: Elsevier, 2009, pp. iii-vi and 267.
Bystrzejewski et al., "Catalyst-free synthesis of onion-like carbon nanoparticles," New Carbon Materials, vol. 25, No. 1, Feb. 2010, p. 1-8.
Cadez et al., "Influence of Hydrocarbons on Vibrational Excitation

(56) References Cited

OTHER PUBLICATIONS of H2 Molecules", Nuclear Engineering and Design, vol. 241, Apr. 2011, p. 1267-1271.

Gicquel et al., "New Driving Parameters for Diamond Deposition Reactors: Pulsed Mode versus Continuous Mode", Materials Research, vol. 6, No. 1, p. 25-37, Sep. 2002.

Jasinski et al., "Hydrogen Production via Methane Reforming Using Various Microwave Plasma Sources", Chem. Listy 102, s1332-s1337, Jan. 2008.

Konno et al., "Direct Preparation of Hydrogen and Carbon Nanotubes by Microwave Plasma Decomposition of Methane over Fe/Si Activated by Biased Hydrogen Plasma", Green and Sustainable Chemistry, Nov. 2012, 3, p. 19-25.

Notice of Allowance dated Jul. 19, 2017 for U.S. Appl. No. 15/351,858.

Office Action dated Mar. 23, 2017 for U.S. Appl. No. 15/428,474.

Notice of Allowance dated May 24, 2017 for U.S. Appl. No. 15/428,474.

Notice of Allowance dated Jun. 29, 2018 for U.S. Appl. No. 15/794,965.

Office Action dated Jul. 10, 2018 for U.S. Appl. No. 15/725,928.

Office Action dated Jun. 26, 2018 for U.S. Appl. No. 15/727,533.

Baldissarelli, Vanessa et al., "Plasma-Assisted Production of Carbon Black and Carbon Nanotubes from Methane Thermal Plasma Reform," J. Braz., Chem. Soc., vol. 25, No. 1, 126-132, 2014, pub. online: Nov. 26, 2011.

Final Office Action dated Mar. 21, 2019 for U.S. Appl. No. 15/918,422.

Non-Final Office Action dated Mar. 21, 2019 for U.S. Appl. No. 15/710,679.

\* cited by examiner

MICROWAVE CHEMICAL PROCESSING REACTOR

RELATED APPLICATIONS

This application is a continuation of U.S. patent application Ser. No. 15/428,474, filed Feb. 9, 2017, and entitled "Microwave Chemical Processing Reactor," which is incorporated fully herein by reference.

BACKGROUND

Microwave plasmas are used in the industrial chemical processing of gases. This is typically accomplished by flowing the gases to be reacted through an elongated vessel while microwave energy is coupled into the vessel to generate a plasma. The plasma cracks the gas molecules into component species. Microwave chemical processing systems are effective because microwave plasmas operate at relatively high power coupling efficiencies at low ion energies, and are capable of supporting various gas reactions, such as the conversion of methane into hydrogen and carbon particulates, the conversion of carbon dioxide into oxygen and carbon, and coating particulates and other seed materials with other layers for functionalization and complex layered materials and aggregates processing.

Typical systems for chemical gas processing include a quartz reaction chamber through which process materials flow, and a microwave magnetron source coupled to the reaction chamber through a waveguide. The input microwave energy can be continuous wave or pulsed. Systems are designed to control the effective coupling of the microwave energy into the reaction chamber, and the gas flow within the reaction chamber to improve the energy absorption by the flowing gas. Often the systems include a wedge located where the microwave waveguide intersects the quartz reaction chamber, to concentrate the electric field within a small area, and the waveguide conductive walls are not exposed to the gases to be processed.

SUMMARY

A processing reactor includes a microwave energy source that provides microwave energy, and a field-enhancing waveguide coupled to the microwave energy source. The field-enhancing waveguide has a first cross-sectional area and a second cross-sectional area. The field-enhancing waveguide includes a field-enhancing zone between the first cross-sectional area and the second cross-sectional area. The field-enhancing waveguide also includes a plasma zone and a reaction zone. The second cross-sectional area is smaller than the first cross-sectional area, is farther away from the microwave energy source than the first cross-sectional area, and extends along a reaction length that forms the reaction zone of the field-enhancing waveguide. The microwave energy propagates in a direction along the reaction length. The processing reactor also includes a supply gas inlet into which a supply gas is flowed, and a process inlet into which a process input material is flowed into the reaction zone. The supply gas inlet is upstream of the reaction zone. In the reaction zone, a majority of the supply gas flow is parallel to the direction of the microwave energy propagation. The supply gas is used to generate a plasma in the plasma zone to convert the process input material into separated components in the reaction zone, where the converting of the process input material occurs at a pressure of at least 0.1 atmosphere.

DETAILED DESCRIPTION

Figure 1A:
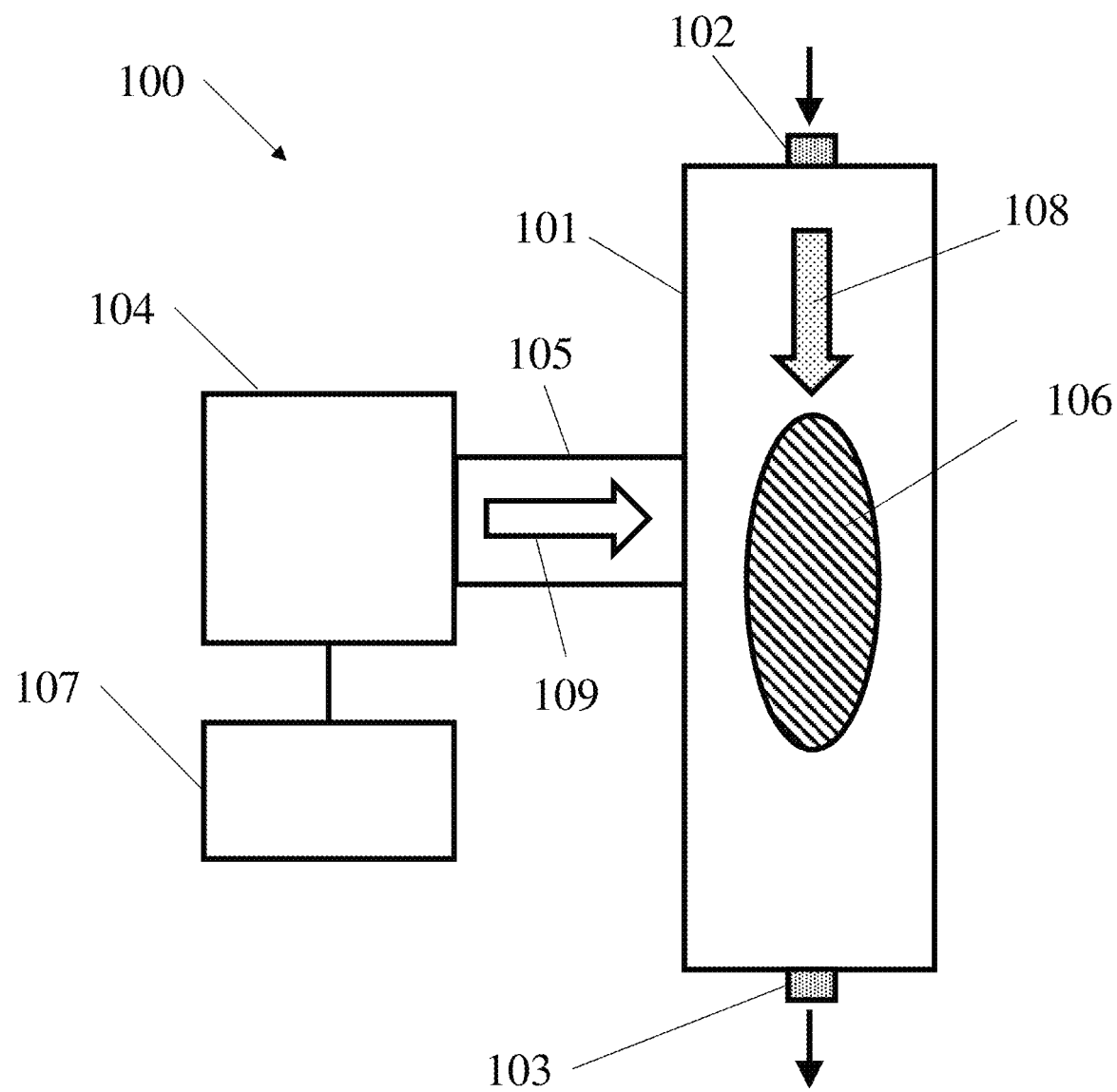
FIG. 1A is a vertical cross-section of a conventional microwave chemical processing system.

Reference now will be made to embodiments of the disclosed invention, one or more examples of which are illustrated in the accompanying drawings. Each example is provided by way of explanation of the present technology, not as a limitation of the present technology. In fact, it will be apparent to those skilled in the art that modifications and variations can be made in the present technology without departing from the scope thereof. For instance, features illustrated or described as part of one embodiment may be used with another embodiment to yield a still further embodiment. Thus, it is intended that the present subject matter covers all such modifications and variations within the scope of the appended claims and their equivalents.

Embodiments of the present systems and methods are used for microwave plasma chemical processing of input materials. In some embodiments, the input materials can be gases, liquids or colloidal dispersions. In microwave plasma chemical processing reactors of various embodiments, the processing of the input materials into separated components occurs in a reaction zone of a waveguide. In this disclosure, embodiments may be described using one type of input material, such as gases, as an example material, but the embodiments may be equally applicable to other types of materials, such as liquids and/or colloidal dispersions. The waveguides of the microwave chemical processing reactors of the present disclosure are field-enhancing waveguides that enable high throughputs of an input material to be processed, where the waveguide itself serves as a reaction chamber rather than having the processed material in a separate quartz chamber from the microwave energy waveguide as in conventional systems. The design of the reactor system provides a large volume for the chemical reactions to occur and reduces the impact of particulate build-up and the amount of particulate on the walls of the reaction chamber. Particulate build-up on the quartz walls in conventional systems reduces the efficiency of the chemical processing since the microwave energy must penetrate the quartz walls in which the processed gas is contained. In the present systems, the microwave energy is propagated in a waveguide that serves as the reaction chamber for the processed material, and thus the microwave energy will not be hindered by particulate that may be deposited onto the walls of the chamber (i.e., waveguide).

As used herein, the term "field-enhancing waveguide" (FEWG) refers to a waveguide with a first cross-sectional area and a second cross-sectional area, where the second cross-sectional area is smaller than the first cross-sectional area and is farther away from the microwave energy source than the first cross-sectional area. The decrease in cross-sectional area enhances the field by concentrating the microwave energy, with the dimensions of the waveguide being set to maintain propagation of the specific microwave frequency being used. The second cross-sectional area of the FEWG extends along a reaction length that forms the reaction zone of the FEWG. There is a field-enhancing zone between the first cross-sectional area and the second cross-sectional area of a FEWG. In some embodiments, the field-enhancing zone can change cross-sectional area in a continuous manner (e.g., linearly or non-linearly) or an abrupt manner (e.g., through one or more discrete steps). In some embodiments, the pressure within the FEWGs are from 0.1 atm to 10 atm, or from 0.5 atm to 10 atm, or from 0.9 atm to 10 atm, or greater than 0.1 atm, or greater than 0.5 atm, or greater than 0.9 atm.

In some embodiments, the microwave plasma chemical processing reactors of the present disclosure have one or more supply gas inlets into which a supply gas is flowed and one or more process inlets into which the input material is flowed. The supply gas and process inlets are located in or upstream of the reaction zone, and the supply gas is used to generate a plasma in the reaction zone. In some embodiments, the supply gas flows are from 1 slm (standard liters per minute) to 1000 slm, or from 2 slm to 1000 slm, or from 5 slm to 1000 slm, or greater than 1 slm, or greater than 2 slm, or greater than 5 slm. In some embodiments, the process material is a gas, and the flow rates are from 1 slm (standard liters per minute) to 1000 slm, or from 2 slm to 1000 slm, or from 5 slm to 1000 slm, or greater than 1 slm, or greater than 2 slm, or greater than 5 slm. In some embodiments, the process material is a liquid or a colloidal dispersion and the flow rates are from less than 1% to greater than 100% of the supply gas flow.

In some embodiments, the microwave plasma chemical processing reactors of the present disclosure have a single microwave energy generator, which is a source of microwave energy coupled to one or more than one FEWG. In some embodiments, the microwave plasma chemical processing reactors of the present disclosure have more than one microwave energy generator, coupled to more than one FEWG. In some embodiments, the microwave energy is continuous wave or pulsed. In some embodiments, the microwave energy generator power is from 1 to 100 kW.

In some embodiments, the microwave plasma chemical processing reactors of the present disclosure have more than one reaction zone, which are connected together and have one or more than one outlet from which to collect the separated components.

In some embodiments, the microwave plasma chemical processing reactors of the present disclosure contain multiple FEWGs with different geometries including manifold arrangements, and network arrangements. These geometries will be described more fully herein.

In some embodiments, the microwave plasma chemical processing reactors of the present disclosure have reaction zones with walls, and the supply gas and process inlets provide the supply gas (for creating the microwave plasma) and input material to the reaction zone through the walls. In some embodiments, there are a plurality of supply gas and process inlets that provide the supply gas and input material to the reaction zone through the walls in controlled mass fractions. Providing the supply gas and input material to the reaction zone through the walls in controlled mass fractions can mitigate the deposition of the separated components on the reaction zone walls.

Some embodiments relate to microwave plasma chemical processing of hydrocarbon gases using various techniques including pulsing of the microwave energy to control the energy of the plasma. The ability to control the energy of the plasma enables the selection of one or more reaction pathways in conversion of the hydrocarbon gases into specific separated components. Pulsed microwave energy can be used to control the energy of the plasma because the short-lived high-energy species that are created when a plasma ignites can be re-generated at the start of each new pulse. The plasma energy is controlled to have a lower average ion energy than conventional techniques, but at a high enough level to enable the targeted chemical reactions to occur at high gas flows and high pressures.

Microwave plasma chemical processing systems using pulsed microwave energy have been developed that control the energy of the plasma and have very high cracking efficiency, in excess of 90%. These conventional systems, however, use low flow rates, below 1 standard liter per minute (slm), and small gas volumes within the plasma, with a consequence that the production rate is low and the production cost is high. These conventional systems cannot increase the gas flow rate and the gas volume within the plasma while using high frequency microwave pulsing (e.g., above roughly 100 Hz) because the plasma cannot ignite fast enough to keep up with the pulses when a large volume and high flow of gas is used.

Microwave Chemical Processing Systems

In the present disclosure, a microwave plasma can be generated in a supply gas and/or process material, and the energy in the plasma is sufficient to form separated components from process material molecules. In some embodiments, a source of microwave energy is coupled to a FEWG, the plasma is generated along a plasma zone of the FEWG, and the process material is separated into components by the plasma along the reaction length in the FEWG. In some embodiments, the microwave energy is coupled directly into the plasma and not through a dielectric wall as in conventional methods.

FIG. 1A illustrates a conventional microwave chemical processing system. As shown in FIG. 1A, a microwave chemical processing system 100 generally includes a reaction chamber 101, one or more gas inlets 102 configured to receive process material 108 flowing into the reaction chamber, one or more outlets 103 configured to collect separated products out of the reaction chamber 101, and a source of microwave energy 104 that is coupled to the reaction chamber through a waveguide 105, among other elements not shown for simplicity. The microwave energy 109 creates a microwave plasma 106 in the reaction chamber 101, and provides energy for reactions to occur. A microwave emitter circuit 107 can control the microwave energy 109 emitted from the microwave energy source 104 to be either continuous wave or pulsed. Given the right conditions, the energy in the plasma will be sufficient to form separated components from the process material molecules.

Microwave Chemical Processing Reactors with Field-Enhancing Waveguides (FEWGS)

Figure 1B:
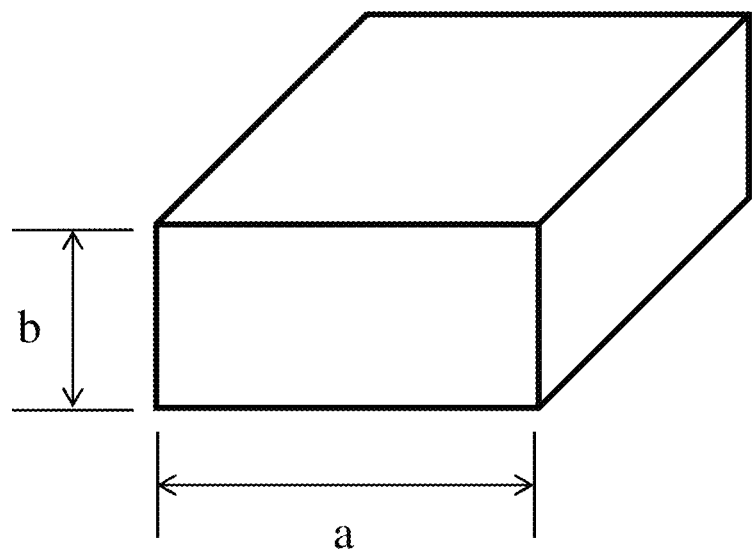
FIGS. 1B-1C show example geometries and dimensions of waveguides of the present disclosure.
Figure 1C:
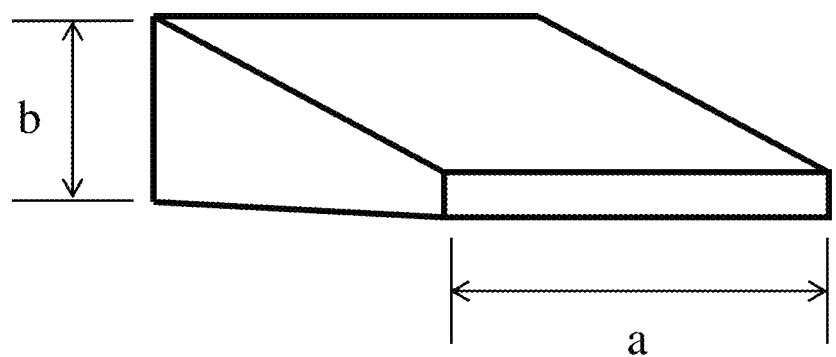

The FEWGs of the present disclosure efficiently transfer microwave frequency electromagnetic energy. The FEWGs of the present disclosure are constructed from conductive material and may be rectangular, circular, or elliptical in cross-section. As shown in FIG. 1B, the widest dimension of a waveguide is called the "a" dimension and determines the range of operating frequencies. The narrowest dimension determines the power-handling capability of the waveguide and is called the "b" dimension. FIG. 1C shows an example of a field-enhancing region of a FEWG, where the widest dimension "a" stays constant in order to effectively transmit a selected frequency of microwave energy, and the narrower dimension "b" is reduced along the length of the FEWG in order to concentrate the microwave energy density. FIG. 1C depicts a linear decrease of dimension "b"; however, the decrease in the dimension "b" could be non-linear (such as parabolic, hyperbolic, etc.), have different rates of decrease along the length (such as different slopes of linear decrease, of linear in one section and non-linear in another section), or contain abrupt steps to decrease the length of dimension "b".

The embodiments described herein are applicable for both stationary wave systems (where the peaks remain at the same location) and traveling wave systems (where the peaks can move).

Figure 2:
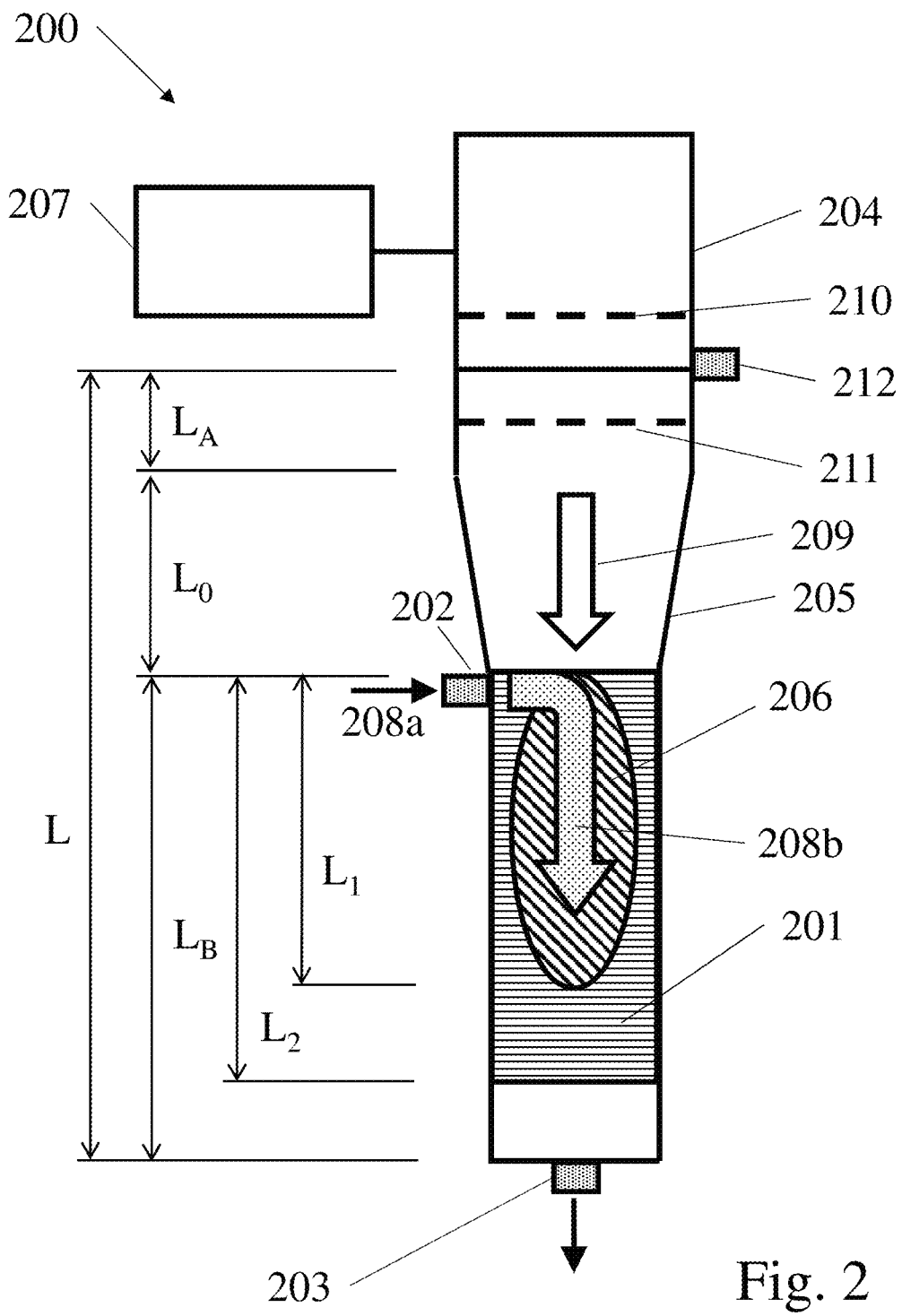
FIG. 2 is a simplified vertical cross-section of a microwave gas processing system in accordance with some embodiments of the present disclosure.
Figure 3:
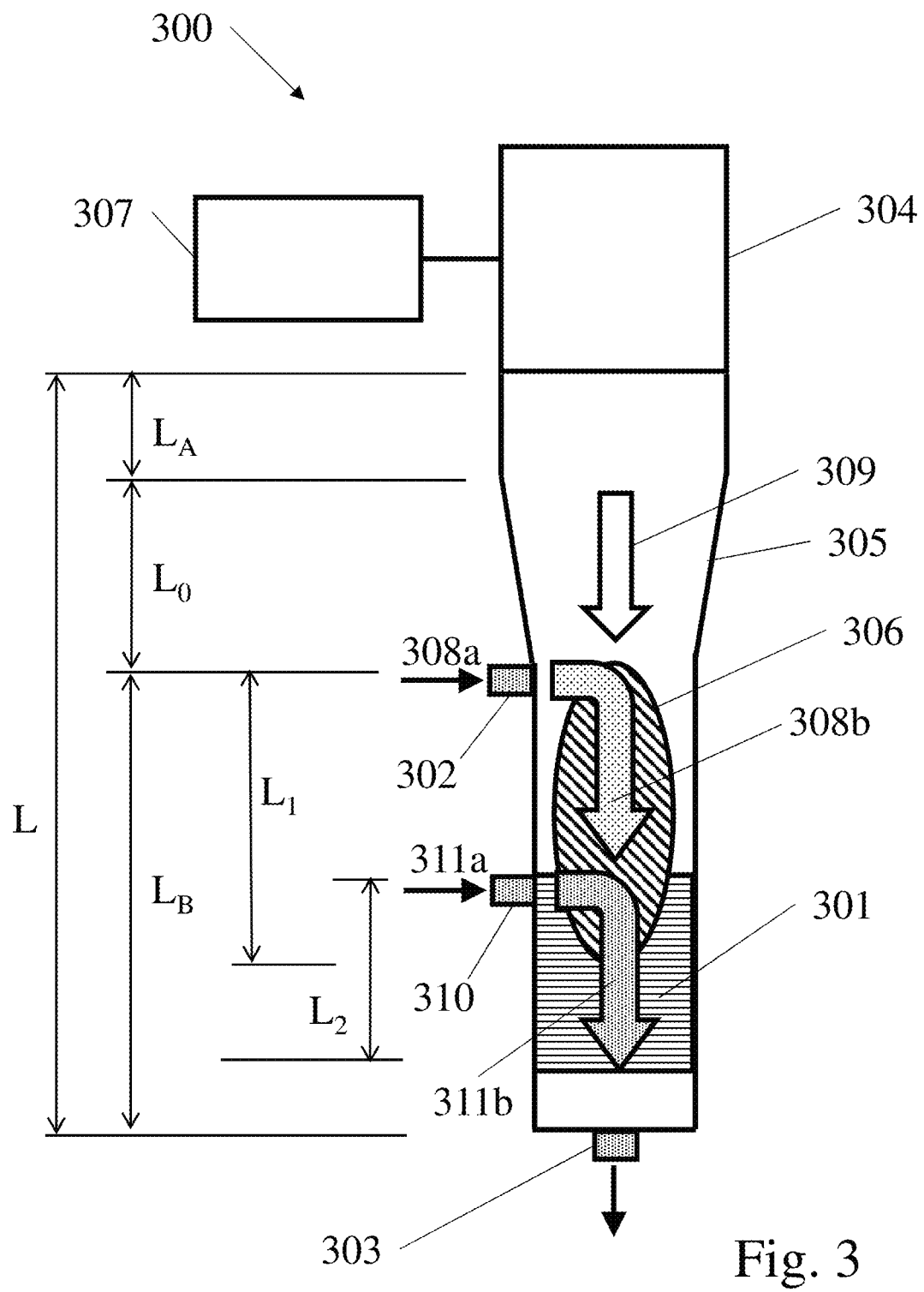
FIG. 3 is a simplified vertical cross-section of a microwave gas processing system in accordance with further embodiments of the present disclosure.

FIGS. 2 and 3 show embodiments of microwave chemical processing systems of the present disclosure, in which a FEWG is coupled to a microwave energy generator (i.e., a microwave energy source), a plasma is generated from a supply gas in a plasma zone of the FEWG, and a reaction length of the FEWG serves as the reaction zone to separate the process material into separate components. The present reactors as demonstrated by FIGS. 2 and 3 are absent of a dielectric barrier between the field-enhancing zone of the field-enhancing waveguide and the reaction zone. In contrast, the reaction zones of conventional systems, are enclosed within a dielectric barrier such as a quartz chamber as explained previously. The direction of propagation of the microwave energy is parallel to the majority of the flow of the supply gas and/or the process material, and the microwave energy enters the waveguide upstream of the portion of the FEWG where the separated components are generated.

As shown in FIG. 2, a microwave chemical processing reactor 200, in accordance with some embodiments, generally includes a FEWG 205, one or more inlets 202 configured to receive supply gas and/or process material 208a flowing into the FEWG 205, and a microwave energy source 204 that is coupled to the FEWG 205, among other elements not shown for simplicity.

In some embodiments, microwave circuit 207 controls a pulsing frequency at which microwave energy 209 from microwave energy source 204 is pulsed. In some embodiments, the microwave energy 209 from microwave energy source 204 is continuous wave.

The FEWG 205 has a length L. The portion of the FEWG 205 with length $L_A$ (shown in FIG. 2 and FIG. 3) is closer to the microwave energy generator than the portion of the FEWG with length $L_B$ (shown in FIG. 2 and FIG. 3). Throughout this disclosure, different portions of the FEWG will be described by a capital L with a subscript denoting the certain portion of the FEWG (e.g., $L_A$, $L_0$, $L_B$, $L_1$, $L_2$), and synonymously, the lengths of the different portions of the FEWG will also be described by a capital L with a subscript denoting the length of a certain portion of the FEWG (e.g., $L_A$, $L_0$, $L_B$, $L_1$, $L_2$).

The cross-sectional area of the FEWG in length $L_B$ is smaller than the cross-sectional area of the FEWG in length $L_A$. The length of the FEWG $L_0$, is located between lengths $L_A$ and $L_B$ of the FEWG, and has a decreasing cross-sectional area along the path of the microwave energy propagation. In some embodiments, the cross-sectional area of the FEWG along length $L_0$ decreases in a continuous manner. In some embodiments, the cross-sectional area of the FEWG along length $L_0$ decreases linearly between lengths $L_A$ and $L_B$. In some embodiments, the cross-sectional area of the FEWG along length $L_0$ decreases non-linearly between lengths $L_A$ and $L_B$, such as decreasing parabolically, hyberbolically, exponentially or logarithmically. In some embodiments, the cross-sectional area of the FEWG along length $L_0$ decreases in a or an abrupt manner between lengths $L_A$ and $L_B$, such as decreasing through one or more discrete steps. The decrease in cross-sectional area serves to concentrate the electric field, thus increasing the microwave energy density while still providing a significant amount of area in which plasma can be formed compared to conventional systems. The portion of the FEWG with length $L_B$ (shown in FIG. 2 and FIG. 3) may have a rectangular cross-section of dimensions 0.75 inches by 3.4 inches when using a microwave energy frequency of 2.45 GHz. This cross-sectional area is much greater than conventional systems where the plasma generation area is generally less than one square inch. The dimensions of the different portions of the FEWG 205 are set according to the microwave frequency, in order to properly function as a waveguide. For example, for an elliptical waveguide the cross-sectional dimensions can be 5.02 inches by 2.83 inches for 2.1-2.7 GHz.

In conventional gas processing systems, the limited region in which plasma can form, such as less than one square inch as described above, constrains the volume in which gas reactions can occur. Also, in conventional systems the microwave energy enters the reaction chamber through a window (typically quartz). In these systems, dielectric materials (e.g., particulate carbon) are coated on the window during processing leading to a decreased power delivery over time. This can be highly problematic if these separated components absorb microwave energy because they can prevent the microwave energy from coupling into the reaction chamber to generate the plasma. Consequently, a rapid build-up of by-products, such as carbon particles that are produced from the gas reactions, occurs and limits the run-time of the processing equipment. In the present embodiments, the system 200 and other embodiments described below are designed without the use of a window in the reaction zone; that is, using a parallel propagation/gas flow system where the energy enters upstream from the reaction. As a result, more energy and power can be coupled into the plasma from the microwave energy source. The lack of a window and the greater volume within the waveguide 205, compared to limited reaction chamber volumes in conventional systems, greatly reduces the issue of particle build-up causing limited run-times, thus improving production efficiency of the microwave processing system.

The microwave energy 209 in FIG. 2 creates a microwave plasma 206 in the supply gas and/or process material within a plasma zone with length $L_1$ (shown in FIG. 2 and FIG. 3) of the length of the FEWG 205. The plasma zone with length $L_1$ is located within the portion of the FEWG $L_B$, where the cross-sectional area is smaller and the microwave energy density is higher than in length $L_A$. In some embodiments, a supply gas that is different from the process material is used to generate the microwave plasma 206. The supply gas may be, for example, hydrogen, helium, a noble gas such as argon, or mixtures of more than one type of gas. In other embodiments, the supply gas is the same as the process material, where the process material is the material from which separated components are being created.

In some embodiments, the supply gas and/or process material inlet 202 is located upstream from the portion of the FEWG $L_B$, or is located within the portion of the FEWG $L_0$, or is located within the portion of the FEWG $L_A$, or is located upstream of the portion of the FEWG $L_A$. In some embodiments, the portion of the FEWG $L_1$ extends from a position along the FEWG downstream from the position where the supply gas and/or process material 208a enters the FEWG, to the end of the FEWG or to a position between the entrance of the supply gas and/or process material and the end of the FEWG 205. In some embodiments, the portion of the FEWG $L_1$ extends from where the supply gas and/or process material 208a enters the FEWG, to the end of the FEWG or to a position between the entrance of the supply gas and/or process material and the end of the FEWG.

The generated plasma 206 provides energy for reactions to occur in process material 208b within a reaction zone 201 of the FEWG 205 having a reaction length $L_2$. In some embodiments, reaction zone $L_2$ extends from where the process material 208a enters the FEWG 205, to the end of the FEWG 205 or to a position between the entrance of the process material and the end of the FEWG 205. Given the right conditions, the energy in the plasma 206 will be sufficient to form separated components from the process material molecules. One or more outlets 203 are configured to collect the separated products out of the FEWG 205 downstream of the reaction zone portion 201 of the FEWG where reactions occur in the process material 208b. In the example shown in FIG. 2, the propagation direction of the microwave energy 209 is parallel with the majority of the supply gas and/or process material flow 208b, and the microwave energy 209 enters the FEWG 205 upstream of the reaction zone 201 of the FEWG where the separated components are generated.

In some embodiments, a pressure barrier 210 that is transparent to microwave energy can be located within the microwave energy source 204, near the outlet of the microwave energy source, or at other locations between the microwave energy source 204 and the plasma 206 produced in the FEWG. This pressure barrier 210 can serve as a safety measure to protect from potential backflow of plasma into the microwave energy source 204. Plasma does not form at the pressure barrier itself; instead, the pressure barrier is simply a mechanical barrier. Some examples of materials that the pressure barrier can be made of are quartz, ethylene tetrafluoroethylene (ETFE), other plastics, or ceramics. In some embodiments, there can be two pressure barriers 210 and 211, where one or both pressure barriers 210 and 211 are within the microwave energy source 204, near the outlet of the microwave energy source, or at other locations between the microwave energy source 204 and the plasma 206 produced in the FEWG. In some embodiments, the pressure barrier 211 is closer to the plasma 206 in the FEWG than the pressure barrier 210, and there is a pressure blowout port 212 between the pressure barriers 210 and 211 in case the pressure barrier 211 fails.

In some embodiments, a plasma backstop (not shown) is included in the system to prevent the plasma from propagating to the microwave energy source 204 or the supply gas and/or process material inlet(s) 202. In some embodiments, the plasma backstop is a ceramic or metallic filter with holes to allow the microwave energy to pass through the plasma backstop, but preventing the majority of the plasma species from passing through. In some embodiments, the majority of the plasma species will be unable to pass the plasma backstop because the holes will have a high aspect ratio, and the plasma species will recombine when they hit the sidewalls of the holes. In some embodiments, the plasma backstop is located between portion $L_0$ and $L_1$, or within portion $L_0$ upstream of portion $L_1$ and downstream of the inlet(s) 202 (in an embodiment where inlet 202 is within portion $L_0$) and the microwave energy source 204.

FIG. 3 shows another embodiment of a microwave chemical processing system 300 in which a supply gas and a process material are injected at different locations. The microwave chemical processing system 300, in accordance with some embodiments, generally includes a FEWG 305, one or more supply gas inlets 302 configured to receive supply gas 308a flowing into the FEWG 305, one or more process material inlets 310 configured to receive process material 311a, and a source of microwave energy 304 that is coupled to the FEWG 305, among other elements not shown for simplicity. The location of process material inlet 310 is downstream of the location of supply gas inlet 302, where downstream is defined in a direction of the microwave energy propagation.

In some embodiments, microwave circuit 307 controls a pulsing frequency at which microwave energy 309 from microwave energy source 304 is pulsed. In some embodiments, the microwave energy from microwave energy source 304 is continuous wave.

Similar to the embodiment shown in FIG. 2, the FEWG 305 in FIG. 3 has portions $L_A$, $L_0$, $L_B$, $L_1$, and $L_2$, where portion $L_B$ has a cross-sectional area smaller than that of $L_A$, portion $L_0$ has a decreasing cross-sectional area between portion $L_A$ and $L_B$, $L_1$ is the portion where the plasma is generated, and $L_2$ is the portion that is the reaction zone.

The microwave energy 309 creates a microwave plasma 306 in the supply gas 308b within a plasma zone $L_1$ of the length L of the FEWG 305. In some embodiments, portion $L_1$ extends from a position along the FEWG 305 downstream from the position where the supply gas 308a enters the FEWG 305, to the end of the FEWG 305 or to a position between the entrance of the supply gas and the end of the FEWG 305. In some embodiments, portion $L_1$ extends from where the supply gas 308a enters the FEWG 305, to the end of the FEWG 305 or to a position between the entrance of the supply gas and the end of the FEWG 305. One or more additional process material inlets 310 are configured to receive process material flowing into the FEWG at a second set of locations downstream of the supply gas inlet(s) 302. The generated plasma 306 provides energy for reactions to occur within the reaction zone 301 of the FEWG 305 having a reaction length $L_2$. In some embodiments, portion $L_2$ extends from where the process material 311a enters the FEWG 305, to the end of the FEWG 305 or to a position between the entrance of the process material and the end of the FEWG 305. Given the right conditions, the energy in the plasma will be sufficient to form separated components from the process material molecules. One or more outlets 303 are configured to collect the separated products out of the FEWG 305 downstream of the portion 301 where reactions occur. In the example system 300 shown in FIG. 3, the propagation direction of the microwave energy 309 is parallel with the majority of the supply gas flow 308*b* and the process material flow 311*b*, and the microwave energy 309 enters the FEWG 305 upstream of the reaction portion 301 of the FEWG where the separated components are generated.

In some embodiments, one or more pressure barriers that are transparent to microwave energy can be located within the microwave energy source 304, near the outlet of the microwave energy source, or at other locations between the microwave energy source 304 and the plasma 306 produced in the FEWG (similar to what is described above and depicted in FIG. 2). In some embodiments, there are two pressure barriers and a pressure blowout port between the pressure barriers in case the barrier closer to the plasma 306 in the FEWG fails.

In some embodiments, the walls of the reaction zone $L_2$ are configured such that the supply gas inlets and process material inlets provide the supply gas and process material to the reaction zone through the walls of the FEWG. For example, the walls can have a series of holes that serve as secondary supply gas inlets through which the supply gas and/or process material can be inserted into the FEWG, or the walls can be permeable to the supply and/or process material, or the walls can be porous. Providing the supply gas and input material to the reaction zone through the walls can mitigate the deposition of the separated components on the reaction zone walls, by forming a reactive plasma close to the wall that etches away deposited material.

In some embodiments, there are a plurality of supply gas and process inlets that provide the supply gas and input material to the reaction zone $L_2$ through the walls of the FEWG. In some embodiments, there are a plurality of supply gas and process inlets that are configured to provide controlled mass fractions of the supply gas and input material to the reaction zone $L_2$ through the FEWG walls. Having supply gas and process material introduced into the FEWG with controlled mass fractions can more effectively etch away any material that is deposited on the walls of the FEWG in the reaction zone. As described above, the FEWG (e.g., 205 in FIG. 2, and 305 in FIG. 3) has a total length L, a portion of the total length $L_A$ and a portion $L_B$ where the cross-sectional area of $L_B$ is smaller than that of $L_A$, a portion $L_1$ along which the plasma is generated, and a portion of the total length $L_2$ along which the process material is converted into the separated components. In some embodiments, the total length L of the waveguide is from 1 cm to 1000 cm. In some embodiments, length $L_0$ of the waveguide is from 1 cm to 100 cm. In some embodiments, length $L_1$ of the waveguide is from 1 cm to 100 cm. In some embodiments, length $L_2$ of the waveguide is from 1 cm to 1000 cm. In some embodiments, the total length L of the waveguide is from 30 cm to 60 cm. In some embodiments, length $L_0$ of the waveguide is from 10 cm to 40 cm. In some embodiments, length $L_1$ of the waveguide is from 10 cm to 30 cm. In some embodiments, length $L_2$ of the waveguide is from 5 cm to 20 cm. In some embodiments, the portion of the FEWG length $L_A$ is from, for example, 0-10 inches for a microwave frequency of 2.45 GHz, although the length can vary according to the microwave frequency used. In some embodiments, the portion of the FEWG length $L_B$ is from, for example, 10-20 inches, which will depend on factors such as the gas flow velocity and microwave power. For example, higher gas flow velocities will expand the reaction zone length. In some embodiments, length $L_1$ is more than 10%, or more than 20%, or more than 30% or more than 40% or more than 50%, or more than 60%, or more than 70%, or more than 80%, or from 10% to 90%, or from 20% to 80%, or from 30% to 70% of the length of the waveguide, L. In some embodiments, length $L_2$ is more than 5%, or more than 10%, or more than 15% or more than 20%, or more than 25% or more than 30%, or more than 35%, or more than 40%, or more than 45%, or more than 50%, or more than 55%, or more than 60%, or from 1% to 90%, or from 1% to 70%, or from 1% to 50%, or from 10% to 50%, or from 10% to 40%, or from 20% to 40% of the length of the waveguide, L.

In some embodiments, the FEWG (e.g., 205 in FIG. 2, and 305 in FIG. 3) is configured to maintain a pressure from 0.1 atm to 10 atm, or from 0.5 atm to 10 atm, or from 0.9 atm to 10 atm, or greater than 0.1 atm, or greater than 0.5 atm, or greater than 0.9 atm. In many conventional systems, the microwave chemical processing is operated at vacuum. However, in the present embodiments with the plasma being generated within the FEWG, operating in a positive pressure environment assists in preventing the generated plasma from feeding back into the microwave energy source (e.g., 204 in FIG. 2, and 304 in FIG. 3).

The FEWG (e.g., 205 in FIG. 2, and 305 in FIG. 3) may have a rectangular cross-section within length $L_B$ of dimensions 0.75 inches by 3.4 inches, to correspond to a microwave energy frequency of 2.45 GHz. Other dimensions of $L_B$ are possible for other microwave frequencies, and dependent upon waveguide mode these cross-sectional dimensions can be from 3-6 inches. The FEWG (e.g., 205 in FIG. 2, and 305 in FIG. 3) may have a rectangular cross-section within length $L_A$ of dimensions 1.7 inches by 3.4 inches, for example, to correspond to a microwave energy frequency of 2.45 GHz. Other dimensions of $L_A$ are possible for other microwave frequencies. The FEWG may be made of any innately conductive material or a material with a sufficient conductive coated layer to propagate greater than 90% of incoming power. Some examples of FEWG materials are a metallic material, a metallic material with a conductive coating, a ceramic material, a ceramic material with a conductive coating, stainless steel, stainless steel coated with a conductive layer (e.g., Al, Ni, Au, or a Ni/Au alloy), stainless steel with an aluminum liner, or a ceramic material coated with a conductive layer. Notably, the FEWG serves as the chamber in which the plasma is generated and the process material reactions to occur, rather than having a separate waveguide and quartz reaction chamber as in conventional systems. Having the FEWG serve as the reactor chamber provides a much larger volume in which gas reactions can occur (e.g., up to 1000 L). This enables high flow rates of process material to be processed, without being limited by a build-up of carbon particulate as occurs in conventional systems. For example, process material flow rates through the inlet (e.g., 202 in FIG. 2, and 310 in FIG. 3) into the waveguide (e.g., 205 in FIG. 2, and 305 in FIG. 3) may be from 1 slm (standard liters per minute) to 1000 slm, or from 2 slm to 1000 slm, or from 5 slm to 1000 slm, or greater than 1 slm, or greater than 2 slm, or greater than 5 slm. Supply gas flow rates through the inlet (e.g., 202 in FIG. 2, and 302 in FIG. 3) into the waveguide (e.g., 205 in FIG. 2, and 305 in FIG. 3) may be, for example, from 1 slm to 1000 slm, or from 2 slm to 1000 slm, or from 5 slm to 1000 slm, or greater than 1 slm, or greater than 2 slm, or greater than 5 slm. Dependent upon the gas plasma properties that result in sufficient plasma density (e.g., secondary electron emission coefficient) the flows can be from 1 slm to 1000 slm and with pressures up to 14 atm.

In some embodiments, the process material is a liquid that is provided through the process material inlet into the FEWG. Some examples of liquids that can be used as process materials are water, alkanes, alkenes, alkynes, aromatic hydrocarbons, saturated and unsaturated hydrocarbons (e.g., of alkanes, alkenes, alkynes, or aromatic hydrocarbons), ethanol, methanol, isopropyl alcohol (i.e., isopropanol), or mixtures thereof (e.g., a 50/50 mixture of ethanol/methanol). In some embodiments, the liquid process materials listed above would produce carbon and hydrogen separated components. In some embodiments, the flow rate of the liquid can be a percentage of the supply gas flow into the reactor, such as from 0.001% to 1000%, or from 0.001% to 100%, or from 0.001% to 10%, or from 0.001% to 1%, or from 0.001% to 0.1%, or from 0.01% to 1000%, or from 0.01% to 100%, or from 0.01% to 10%, or from 0.01% to 1%, or from 0.01% to 0.1%.

In some embodiments, the process material is a colloidal dispersion (i.e., a mixture of solid particles suspended in a liquid or a gas) that is provided through the process material inlet into the FEWG. For example, the colloidal dispersion can include carbonaceous particles. Some examples of colloidal dispersions that can be used as process materials are solid particles from the Group 16, Group 14, Group 10, Group 9, Group 5, Group 2, Group 1, alloys thereof, and mixtures thereof, mixed with a liquid or a gas. In some embodiments, the solid particles listed above can be mixed with liquids such as water, alkanes, alkenes, alkynes, aromatic hydrocarbons, saturated and unsaturated hydrocarbons (e.g., of alkanes, alkenes, alkynes, or aromatic hydrocarbons), ethanol, methanol, isopropyl alcohol, or mixtures thereof (e.g., a 50/50 mixture of ethanol/methanol). Examples of gases are Group 1 and Group 15-18, as well as inorganic compounds (e.g., group 14 hydride). Some examples of separated components that can be produced from the colloidal dispersion process materials listed above are solid inorganic materials coated in organic materials (e.g., silicon coated with graphene), and composite materials with interlayers of organic/inorganic materials (e.g., a silicon core with a layer of carbon encapsulating the silicon, coated with an additional inorganic layer). In some embodiments, the flow rate of the colloidal dispersion can be a percentage of the supply gas flow into the reactor, such as from 0.001% to 1000%, or from 0.001% to 100%, or from 0.001% to 10%, or from 0.001% to 1%, or from 0.001% to 0.1%, or from 0.01% to 1000%, or from 0.01% to 100%, or from 0.01% to 10%, or from 0.01% to 1%, or from 0.01% to 0.1%.

In some embodiments, the process material is a gas. In some embodiments, the process material is a hydrocarbon gas, such as $C_2H_2$, $C_2H_4$, $C_2H_6$. In some embodiments, the process material is methane, and the separated components are hydrogen and nanoparticulate carbon. In some embodiments, the process material is carbon dioxide with water, and the separated components are oxygen, carbon and water. In some embodiments, the process material is $H_2S$ and the separated components are hydrogen gas and sulfur. In some embodiments, the process material does not contain carbon dioxide. In some embodiments, the process material is a complex gas-based material, for example $SiH_4$, trimethylaluminum (TMA), trimethylgallium (TMG), glycidyl methacrylate (GMA), $SF_6$, and other materials used in the semiconductor industry for the deposition and etching of metals and dielectrics.

In some embodiments, one of the separated components is nanoparticulate carbon such as, but not limited to, carbon black, carbon nano-onions (CNOs), necked CNOs, carbon nanospheres, graphite, pyrolytic graphite, graphene, graphene nanoparticles, graphene platelets, fullerenes, hybrid fullerenes, single-walled nanotubes and multi-walled nanotubes. One or more of these nanoparticulate carbons may be produced during a particular process run. In some embodiments, the separated components comprise nanoparticulate carbon that is in agglomerate—which may also be described as aggregate—particles. In some cases, the agglomerate or aggregate particles comprise many nanoparticulate carbon particles. In some embodiments, the agglomerate or aggregate particles comprise nanoparticulate carbon particles and have average diameter greater than 50 microns, or greater than 100 microns, or greater than 200 microns, or greater than 300 microns, or greater than 500 microns, or greater than 1000 microns, or from 1 to 1000 microns, or from 10 to 1000 microns, or from 100 to 1000 microns, or from 100 to 500 microns.

Tuning Microwave Energy in Microwave Chemical Processing Systems

Different process materials require different amounts of energy to react into different separated components. In the present disclosure, the available reaction pathways can be selected by changing the average energy of the plasma. In some embodiments, the microwave energy coupled to the plasma is pulsed, and the average energy of the plasma, and therefore the reaction pathways, are selected by controlling the microwave energy pulse duration and frequency, duty cycle, shape, and time-averaged output power level. Additional details of tuning microwave energy in microwave chemical processing systems are disclosed in U.S. patent application Ser. No. 15/351,858, entitled "Microwave Chemical Processing" and filed on Nov. 15, 2016, which is owned by the assignee of the present application and is hereby incorporated by reference in its entirety.

In some embodiments, the average energy in the plasma is controlled by changing the pulse period, by choosing a pulsing frequency to achieve a desired plasma energy. Additionally, in some embodiments, the average energy of the plasma is controlled by controlling the duty cycle. This can be understood by contemplating the situation where the time-averaged input power and the pulse period are both held constant and the duty cycle is varied. A shorter duty cycle will increase the magnitude of the power coupled into the chamber when the microwave energy is on. This is advantageous because a relatively low amount of power (i.e., time-averaged power) can be used to generate reaction products from reaction pathways that would be impossible to facilitate at the same power in a continuous wave.

In some embodiments, the reaction pathways can be selected by controlling time-averaged power input into the plasma. For example, if the duty cycle and pulse frequency are held constant, and the power input into the microwave generator is increased, then the energy of the plasma will increase. By way of another example, if the duty cycle and pulse frequency are held constant, and the power is more effectively coupled into the reaction chamber, then the energy of the plasma will increase.

In some embodiments, the reaction pathways can be selected by controlling a shape of the microwave energy pulse. In some embodiments, the microwave pulse is a rectangular wave, where the power is constant during the duration of the pulse period when the microwave is on. In some embodiments, the pulse power is not constant during the duration of the pulse period when the microwave power is on. In some embodiments, the microwave pulse is a triangular wave, or a trapezoidal wave, or a different wave profile. The plasma can be referred to as diffuse during the time period when the high energy species exist in higher fractions (i.e., at the beginning of the pulse, before the plasma reaches equilibrium). In some embodiments, the microwave energy increases over the time period where the plasma is diffuse, which increases the time average fraction of high energy species in the plasma.

As described above, tuning the pulse frequency, duty cycle, and pulse shape can enable the creation of a higher fraction of higher energy species within the plasma for a given time-averaged input power. The higher energy species can enable additional reaction pathways that would otherwise not be energetically favorable.

The techniques above can be further understood by using methane ($CH_4$) as an example process material, to be separated into hydrogen and nanoparticulate carbon. Typically, 4-6 eV is needed to dissociate methane ($CH_4$); however, the plasma energy typically settles at approximately 1.5 eV after an initial ignition energy spike. By pulsing the microwave, the average plasma energy (i.e. time-averaged plasma energy) is maintained at the higher levels, where the frequency and duration of the pulsing controls the average plasma energy. Specifically, pulsing parameters such as frequency and duty cycle can be controlled to provide an average plasma energy of 4-6 eV to select specific dissociation reactions of the methane. Another advantage of pulsing the microwave energy is that the energy is more distributed throughout the chamber in which microwave is being input. In conventional systems, at equilibrium the plasma forms a dense layer of ionized species in the chamber towards the location of the microwave input, which absorbs the incoming microwave energy and consequently prevents further microwave energy from penetrating deeper into the chamber. The high frequency pulsing of the present disclosure maintains the plasma in a non-equilibrium state for a greater fraction of time and the dense layer of ionized species is present for a smaller fraction of time, which allows the microwave energy to penetrate deeper into the chamber and the plasma to be generated in a larger volume within the chamber.

More generally, in various embodiments of the present disclosure the average energy of the plasma over the entire duration of the pulse period may be from 0.9 eV to 20 eV, or from 0.9 to 10 eV, or from 1.5 eV to 20 eV, or from 1.5 eV to 10 eV, or greater than 0.9 eV, or greater than 1.5 eV. The specific values to which the plasma energy is tuned will depend on the type of process material being utilized.

In the microwave processing systems described above, the microwave energy source is controlled by a microwave emitter circuit (e.g., 207 in FIG. 2, and 307 in FIG. 3), that can control the microwave energy emitted from the source to be either continuous wave or pulsed. In some embodiments, the microwave emitter circuit produces microwave energy through the use of a magnetron, e.g., at 915 MHz, 2.45 GHz, or 5.8 GHz. To control the output power of the microwave energy, the microwave emitter circuit may pulse the magnetron at various frequencies and duty cycles. Each microwave emitter circuit is designed for a specific range of pulsing frequency, duty cycle, shape, and output power level, where the selection of specific values of these parameters is used to tune the chemical reaction pathways in the process material.

In some embodiments, the microwave control circuit enables a pulse frequency from 500 Hz to 1000 kHz, or from 1 kHz to 1000 kHz, or from 10 kHz to 1000 kHz, or from 40 kHz to 80 kHz, or from 60 to 70 kHz, or greater than 10 kHz, or greater than 50 kHz, or greater than 100 kHz. In some embodiments, the microwave source emits continuous wave or pulsed microwave energy with a time-average power from 1 to 100 kW, or from 1 kW to 500 kW, or from 1 kW to 1 MW, or from 10 kW to 5 MW, or greater than 10 kW, or greater than 100 kW, or greater than 500 kW, or greater than 1 MW, or greater than 2 MW. The pulse period has a first duration where the microwave power is on, and a second duration where the microwave energy is off or at a lower power than during the first duration. In some embodiments, the second duration is longer than the first duration. The optimal duty cycle for a given system depends on many factors including the microwave power, pulse frequency, and pulse shape. In some embodiments, the duty cycle (i.e., the fraction of the pulse period where the microwave energy is on, expressed as a percentage) is from 1% to 99%, or from 1% to 95%, or from 10% to 95%, or from 20% to 80%, or from 50% to 95%, or from 1% to 50%, or from 1% to 40%, or from 1% to 30%, or from 1% to 20%, or from 1% to 10%, or less than 99%, or less than 95%, or less than 80%, or less than 60%, or less than 50%, or less than 40%, or less than 30%, or less than 20%, or less than 10%.

Microwave Chemical Processing Reactors with Mutliple Field-Enhancing Waveguides

FIGS. 4A-4D show block diagrams representing embodiments of microwave chemical processing systems of the present disclosure, in which multiple FEWGs are coupled to one or more microwave energy generators (i.e., a microwave energy sources). The FEWGs in these embodiments can share some or all of the features of the systems described above. The supply gas and process material inputs in these embodiments can also share some or all of the features described above. In some embodiments, each FEWG has a reaction zone. In some embodiments, a plasma is generated from a supply gas in a plasma zone in each of the FEWGs, and a reaction length of each of the FEWGs serve as reaction zones to separate the process material into separate components. In some embodiments, the reaction zones are connected together and the microwave chemical processing system has one outlet for the separated components. In some embodiments, the reaction zones are connected together and the microwave chemical processing system has more than one outlet for the separated components. In some embodiments, each reaction zone has its own outlet for the separated components.

Figure 4A:
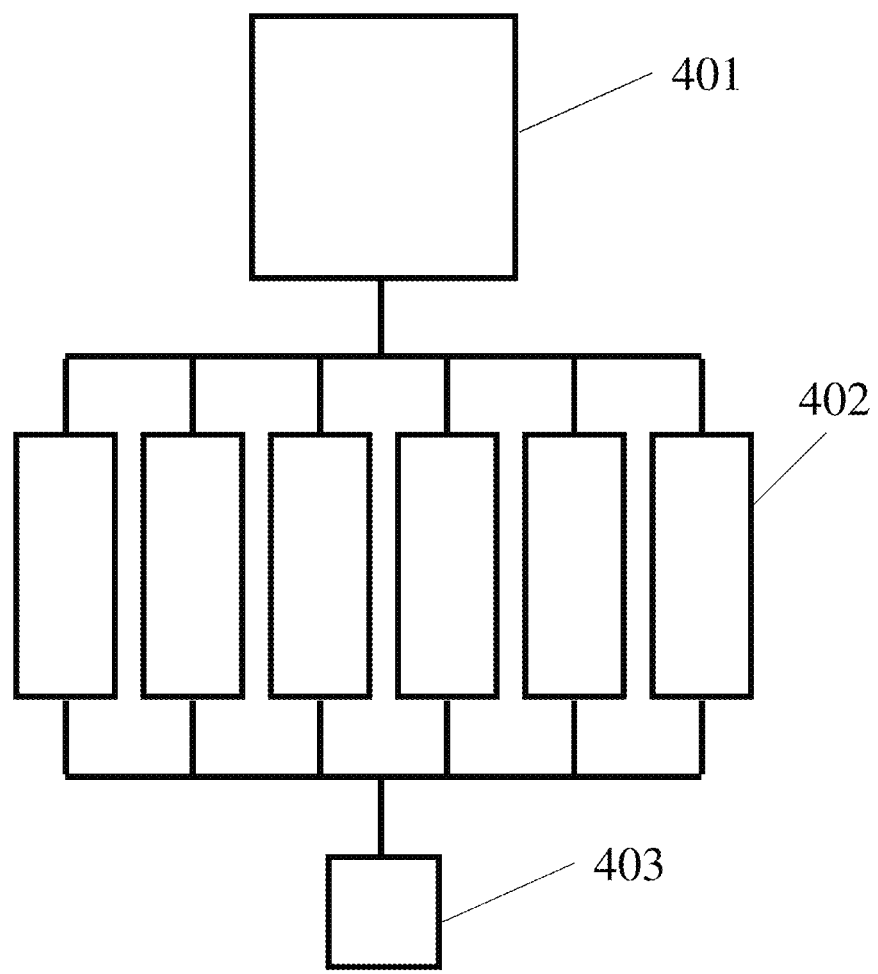
FIGS. 4A-4D are block diagrams of microwave chemical processing systems having multiple field-enhancing waveguides and multiple microwave energy sources, in accordance embodiments of the present disclosure.

FIG. 4A shows an embodiment where there is one microwave energy generator 401 coupled to multiple FEWGs 402, and the reaction zones of the FEWGs are all connected together such that there is a single outlet 403 to collect the separated components.

Figure 4B:
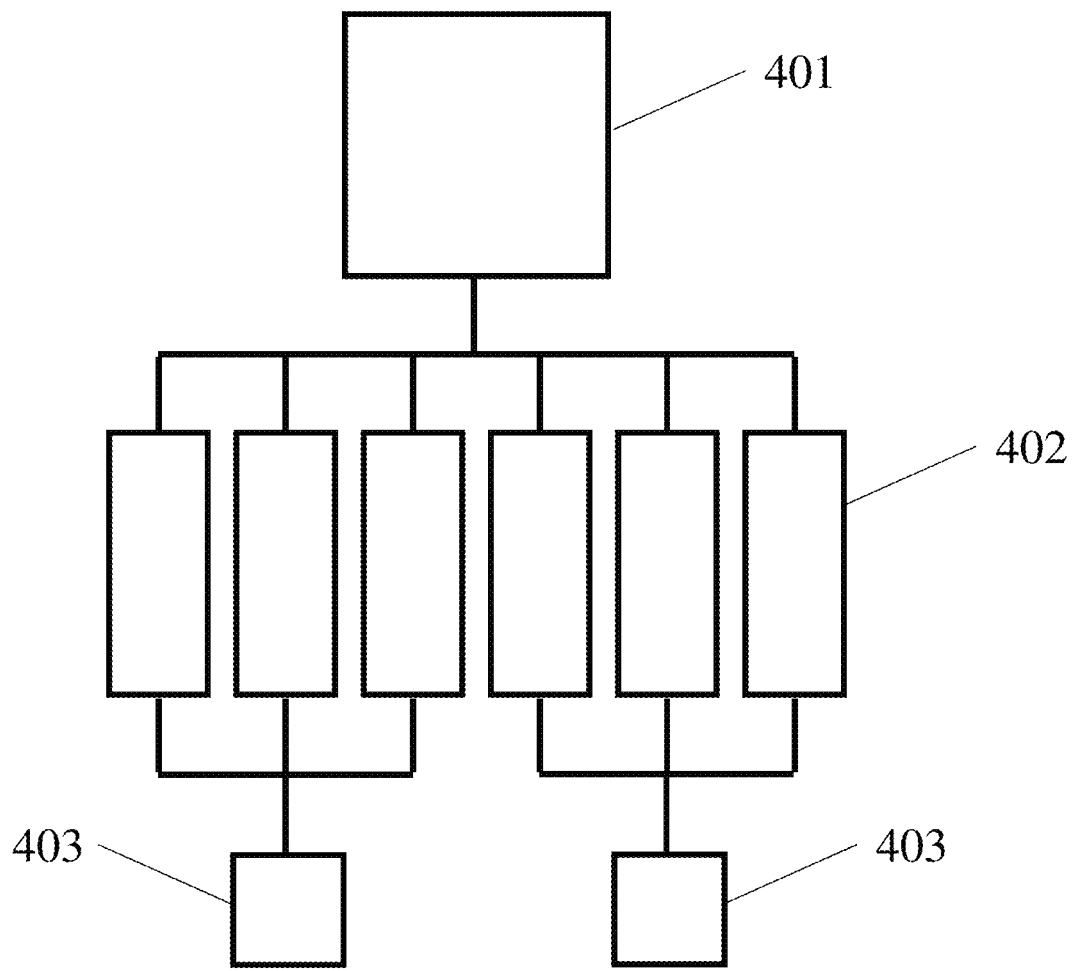

FIG. 4B shows an embodiment where there is one microwave energy generator 401 coupled to multiple FEWGs 402, and the reaction zones of some the FEWGs are connected together such that there more than one outlet 403 to collect the separated components.

Figure 4C:
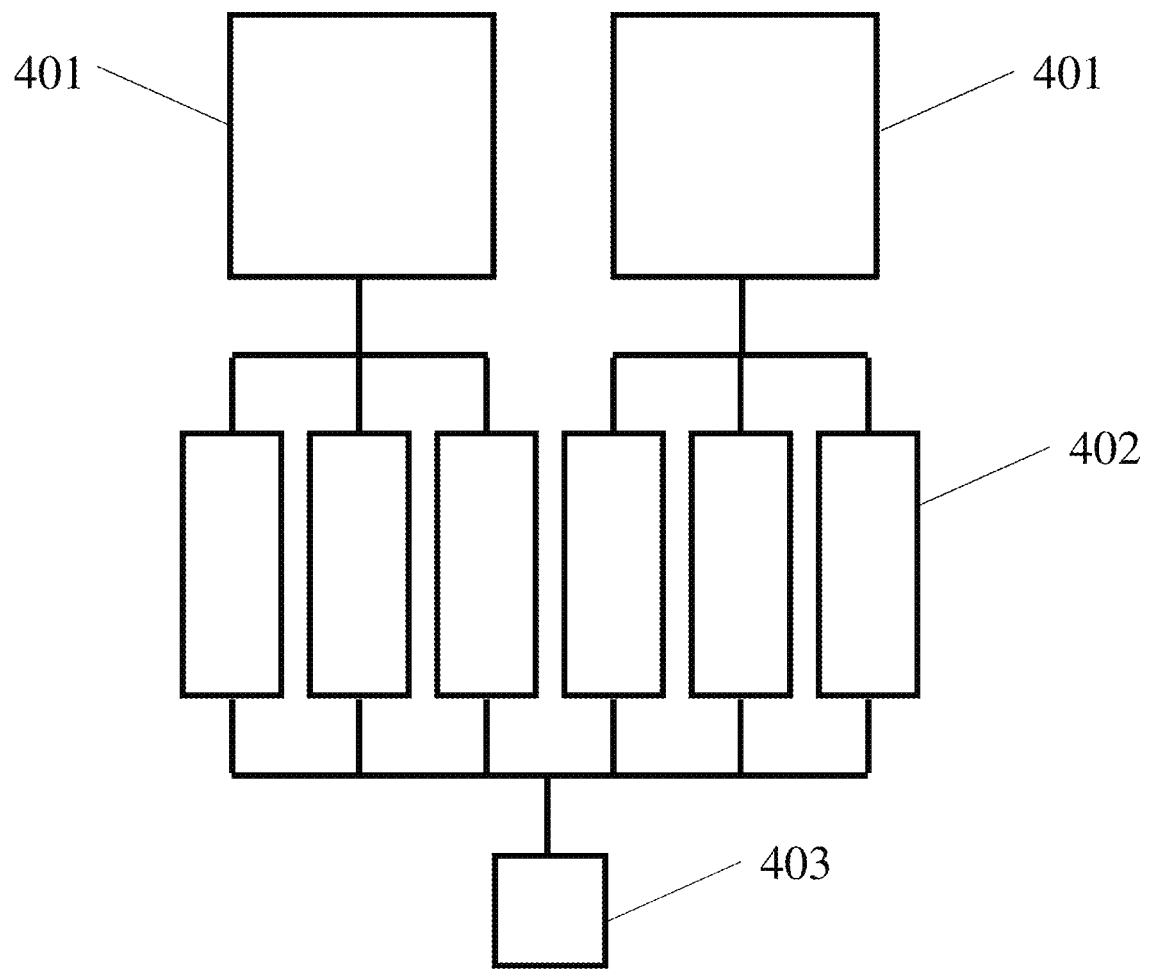

FIG. 4C shows an embodiment where there is more than one microwave energy generator 401 coupled to multiple FEWGs 402, and the reaction zones of the FEWGs are all connected together such that there is a single outlet 403 to collect the separated components.

Figure 4D:
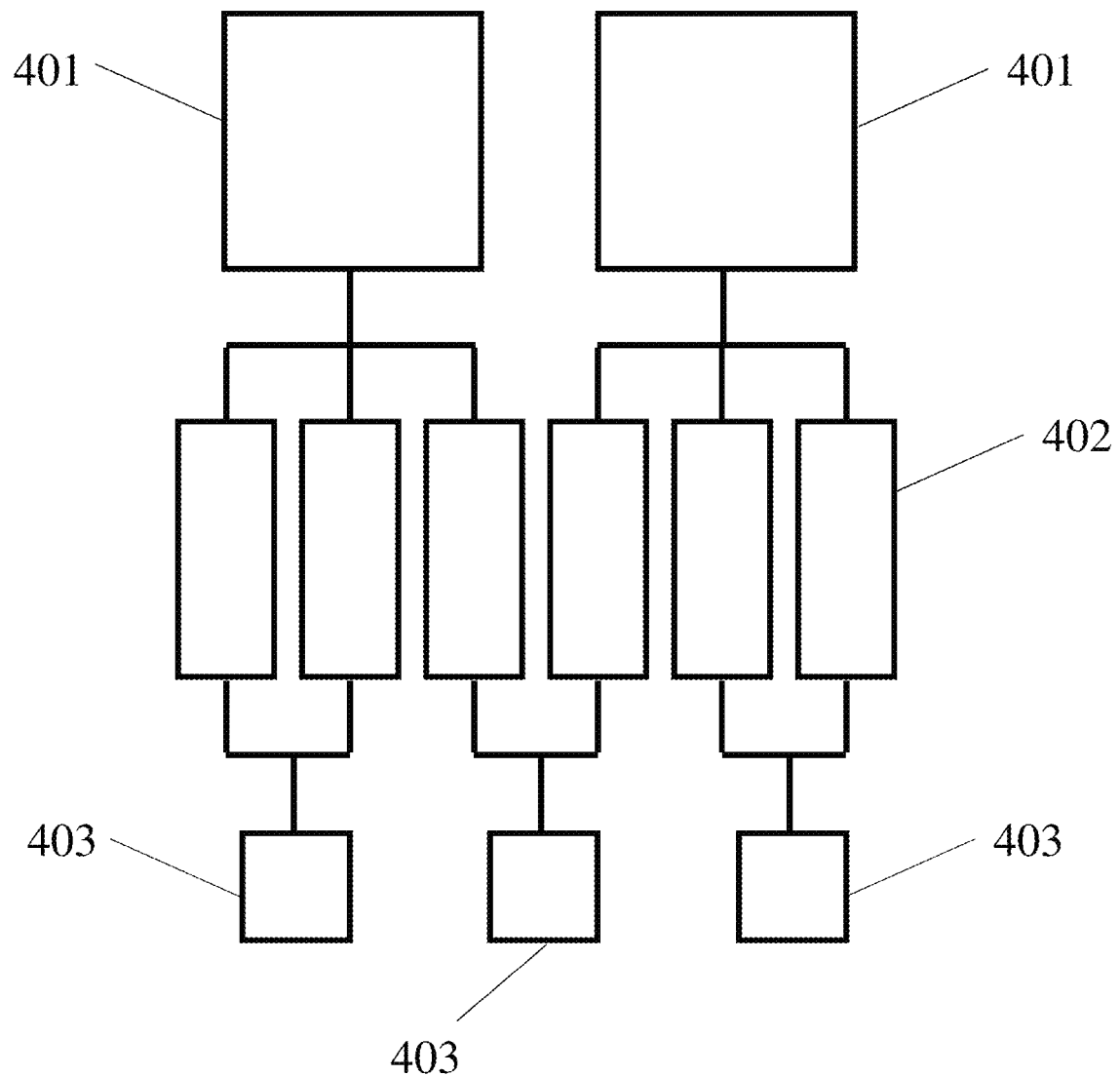

FIG. 4D shows an embodiment where there is more than one microwave energy generator 401 coupled to multiple FEWGs 402, and the reaction zones of some the FEWGs are connected together such that there more than one outlet 403 to collect the separated components.

FIGS. 4A-4D depict 6 FEWGs for illustrative purposes, but in some embodiments, there are fewer or greater than 6 FEWGs. For example, in some embodiments, there are from 1 to 10 FEWGs coupled to each microwave energy generator. In some embodiments, the microwave energy from more than one microwave generator can be combined using a power combiner, and then the combined microwave energy can be coupled into more than one FEWG. The microwave energy emitted from such a power combiner can be very large, and can be coupled into many FEWGs (e.g., more than 10). In some embodiments, multiplexing is used to couple microwave energy into multiple FEWGs from a single microwave energy source. In one example, the multiplexing is time-division multiplexing which means that the energy is coupled from a microwave energy source into one set of FEWGs at one moment in time, and a switch is used to direct the energy into a different set of FEWGs at a later moment in time. The switch can be used to cycle energy between many sets of FEWGs (e.g., more than 2, or more than 5, or more than 10) from a single microwave energy source over time, where each set of FEWGs can contain multiple FEWGs (e.g., more than 2, or more than 5, or from 1 to 10). FIGS. 4B and 4D depict two outlets, but there can be more than two outlets, and each FEWG can have its own outlet to collect the separated components. In some embodiments, there are from 1 to 10 outlets to collect the separated components. FIGS. 4B and 4D depict 3 FEWGs connected into each outlet, but there can be fewer or greater than 3 FEWGs connected into each outlet, and each FEWG can have its own outlet to collect the separated components. FIGS. 4C and 4D depict two microwave energy generators, but in some embodiments, there are more than 2 microwave energy generators. In some embodiments, there are from 1 to 10 FEWGs connected together into each outlet to collect the separated components.

Figure 5A:
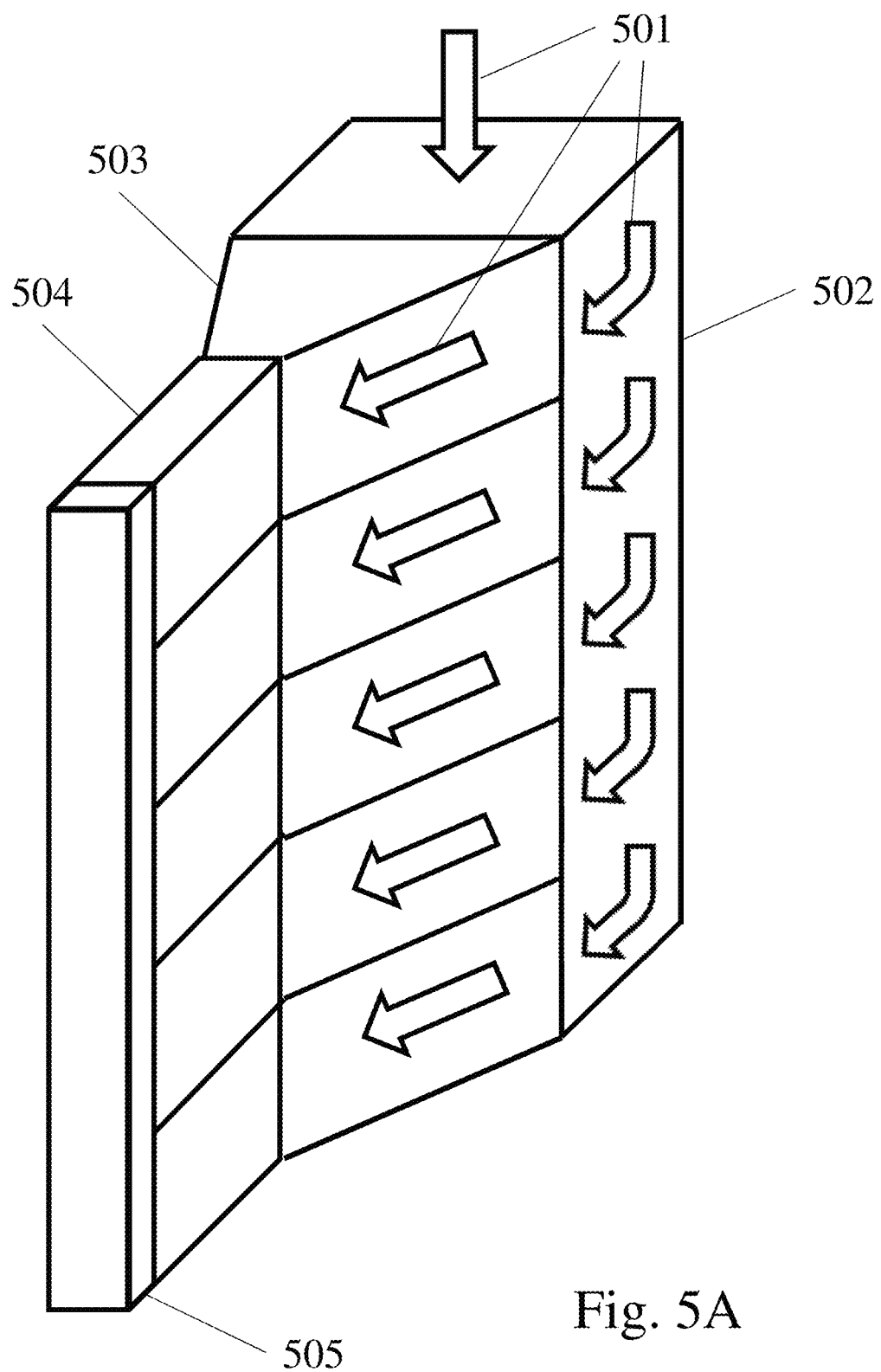
FIGS. 5A-5B are simplified diagrams of microwave chemical processing systems in which multiple field-enhancing waveguides are coupled to one microwave energy generator, in accordance embodiments of the present disclosure.
Figure 5B:
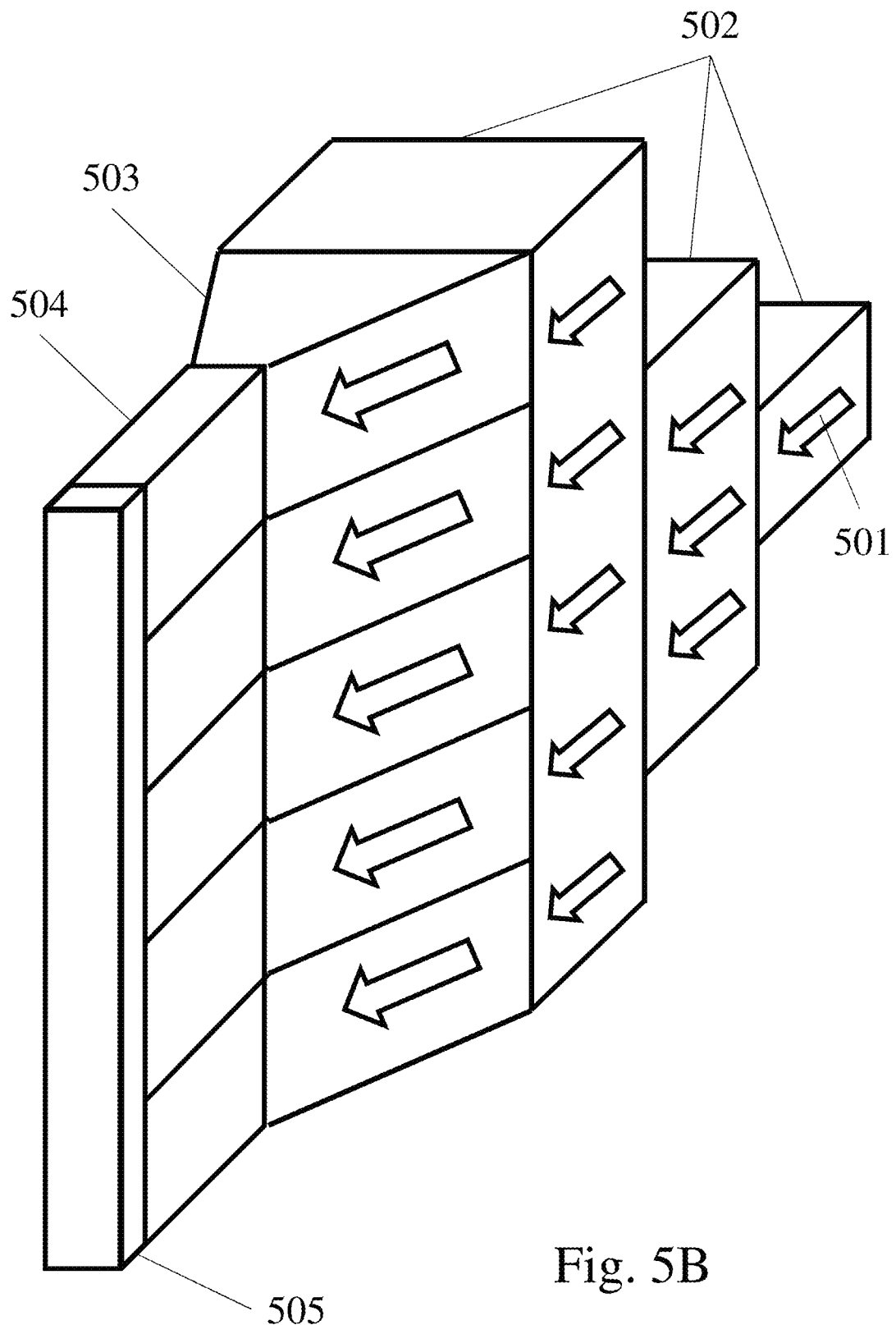

FIGS. 5A-5B show embodiments of microwave chemical processing systems of the present disclosure, in which multiple FEWGs are coupled to one microwave energy generator (i.e., microwave energy sources) using different geometries. The FEWGs in these embodiments can share some or all of the features of the systems described above. The supply gas and process material inputs in these embodiments can also share some or all of the features described above. In some embodiments, each FEWG has a reaction zone. In some embodiments, a plasma is generated from a supply gas in a plasma zone in each of the FEWGs, and a reaction length of each of the FEWGs serve as reaction zones to separate the process material into separate components. In some embodiments, the reaction zones are connected together and the microwave chemical processing system has one outlet for the separated components. In some embodiments, the reaction zones are connected together and the microwave chemical processing system has more than one outlet for the separated components. In some embodiments, each reaction zone has its own outlet for the separated components.

FIG. 5A shows an embodiment with a manifold geometry where there is one microwave energy generator coupled to multiple FEWGs. The microwave energy 501 is coupled to a manifold waveguide 502, and then is coupled into multiple FEWGs. The microwave energy enters the large cross-sectional area section of each the FEWGs, then into the field-enhancing zone of the FEWGs 503, and is then coupled into the smaller cross-sectional area reaction zones of the FEWGs 504. In the embodiment depicted in FIG. 5A, all of the FEWGs are all connected together such that there is a single outlet 505 to collect the separated components.

FIG. 5B shows an embodiment with a network geometry where there is one microwave energy generator coupled to multiple FEWGs. The microwave energy 501 is coupled to a network waveguide 502, and then is coupled into multiple FEWGs. The specific network waveguide dimensions are dependent on the microwave frequency being used. The microwave energy enters the large cross-sectional area section of each the FEWGs, then into the field-enhancing zone of the FEWGs 503, and is then coupled into the smaller cross-sectional area reaction zones of the FEWGs 504. In the embodiment depicted in FIG. 5B, all of the FEWGs are all connected together such that there is a single outlet 505 to collect the separated components.

FIGS. 5A-5B depict one microwave energy generator coupled to 5 FEWGs in a manifold or network geometry, but in some embodiments, there is one microwave energy generator coupled to fewer or greater than 5 FEWGs in a manifold or network geometry. In some embodiments, the microwave energy from more than one microwave generator can be combined using a power combiner, and then the combined microwave energy can be coupled into more than one FEWG in a manifold or network geometry. The microwave energy emitted from such a power combiner can be very large, and can be coupled into many FEWGs (e.g., more than 10) in a manifold or network geometry. In some embodiments, there are from 1 to 10 FEWGs coupled to each microwave energy generator in a manifold or network geometry. FIGS. 5A-5B depict one outlet, but there can be more than one outlet from FEWGs coupled to microwave energy generators in a manifold or network geometry. In some embodiments, there are from 1 to 10 outlets to collect the separated components from FEWGs coupled to microwave energy generators in a manifold or network geometry. FIGS. 5A-5B depict one microwave energy generator coupled to multiple FEWGs, but in some embodiments, there is from 1 to 10 microwave energy generators coupled to from 1 to 10 FEWGs in a manifold or network geometry. In some embodiments, there are from 1 to 10 FEWGs connected together into each outlet to collect the separated components from FEWGs coupled to microwave energy generators in a manifold or network geometry.

In some embodiments, there are apertures between the manifold or network geometry waveguides 502 and the field-enhancing zones of the FEWGs 503. The dimensions of these apertures are tailored to effectively couple the microwave energy from the manifold or network geometry waveguides 502 to the field-enhancing zones of the FEWGs 503. In some embodiments, the dimensions of these apertures are different sizes to balance the microwave energy transmission from the manifold or network geometry waveguides 502 between all of the coupled field-enhancing zones of the FEWGs 503.

In some embodiments, the dimensions of the manifold or network geometry waveguides 502 are tailored such that they form a resonant cavity and there is (are) standing wave(s) of microwave energy within the manifold or network geometry waveguides 502. In some embodiments, the standing wave of microwave energy is tuned to effectively couple microwave energy into each of the coupled field-enhancing zones of the FEWGs 503.

In some embodiments, there is controlled leakage from the manifold or network geometry waveguides 502 to the field-enhancing zones of the FEWGs 503 to effectively distribute the amount of microwave energy coupled into each of the reaction zones of the FEWG 504. Some examples of designs to control the leakage from the manifold or network geometry waveguides 502 to the field-enhancing zones of the FEWGs 503 and effectively distribute the amount of microwave energy coupled into each of the reaction zones of the FEWG 504 are: changing the cross-section and/or lengths of the waveguides; using apertures between the manifold or network geometry waveguides 502 and the field-enhancing zones of the FEWGs 503; changing the angle of orientation between the manifold or network geometry waveguides 502 and the field-enhancing zones of the FEWGs 503; using filaments, point sources, electrodes and/or magnets within the manifold or network geometry waveguides or within the FEWGs (as will be discussed in further detail below); and combinations of two or more of these design features.

Additional Features in Microwave Chemical Processing Reactors with Field-Enhancing Waveguides In addition to the above features of microwave processing systems with FEWGs, further features shall now be discussed that can be used in the systems described above.

Figure 6:
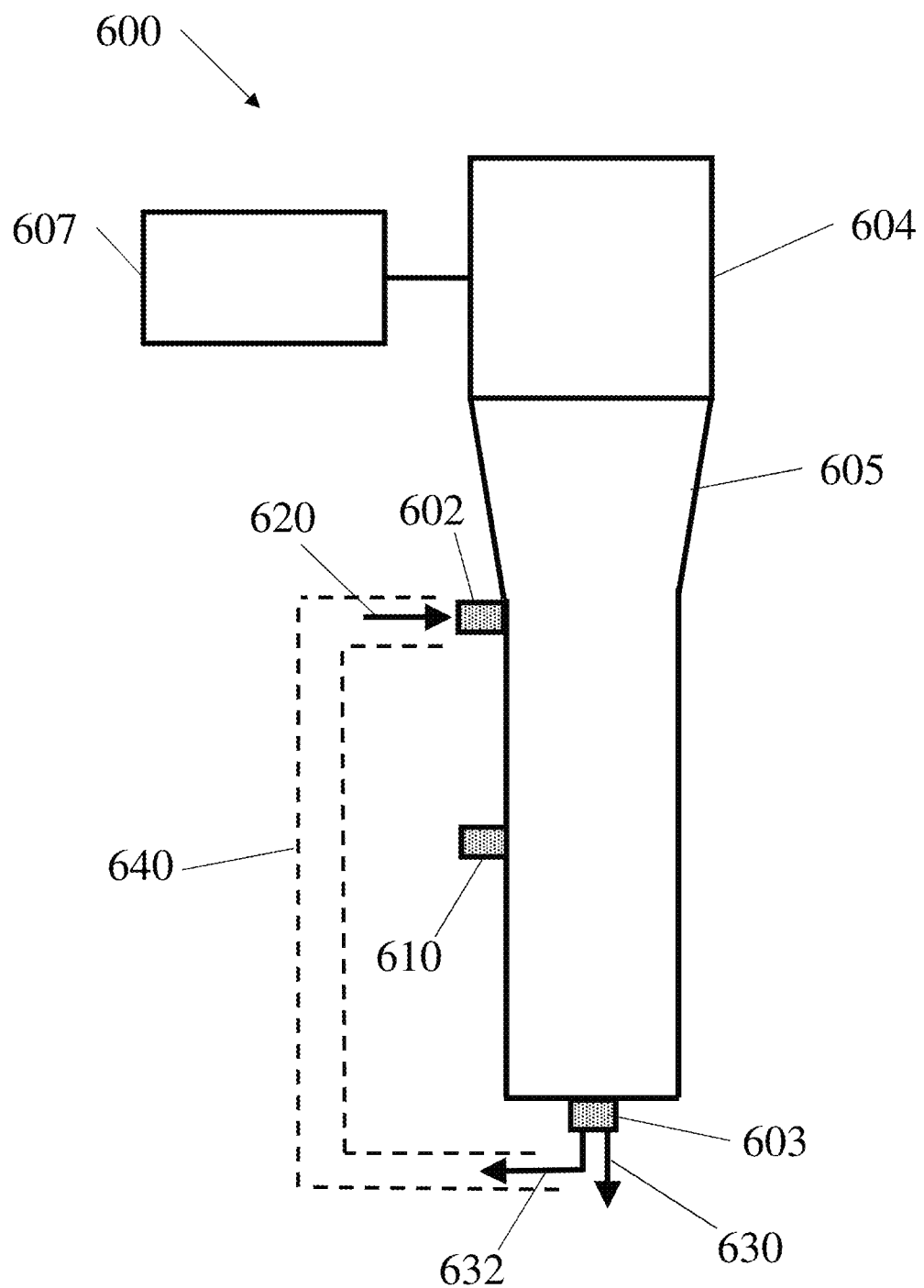
FIG. 6 is a simplified vertical cross-section of a microwave gas processing system with precursor gas input, in accordance with embodiments of the present disclosure.

FIG. 6 illustrates a microwave process system with a FEWG, where the plasma is generated in one or more precursor gases, where the precursor gases are inserted upstream from where the process material is flowed into the reaction zone of the FEWG. Precursor gases improve cracking efficiency by adding species of various ionization potentials. That is, different gases have different ionization energies, which is the amount of energy required to remove an electron from an atom or molecule is. In addition, various gases have different pair production (how many electrons per ion can be produced) and secondary electron emission properties (emission of electrons when the charged particles strike a surface). Thus, in the present disclosure the use of precursor gases can be utilized to affect the energy of the plasma.

In FIG. 6, a microwave gas processing system 600 includes a microwave energy generator (i.e., microwave energy source) 604, a FEWG 605, and a microwave emitter circuit 607 similar to previous embodiments. The diagram of FIG. 6 is a simplified drawing compared to the previous figures for clarity. A supply gas inlet 602 receives a precursor gas 620 which supplements the supply gas (not shown) to create the plasma in the waveguide. In various embodiments, the precursor gas 620 may include one or more of hydrogen, argon, helium, or various noble gases. Process material inlet 610 is configured to receive the process material that is to be reacted, similar to previous embodiments.

In some embodiments, one or more of the separated components of the process material are recycled back into the supply gas and/or process material entering the FEWG 605. For precursor gases that are not desired output products of the system (e.g., argon precursor gas in processing of methane), the precursor gases are removed from the separated components 630 and 632 that are output from outlet 603 in post-process steps. As shown in FIG. 6, gas reactions in the FEWG 605 produce separated components 630 and 632. For example, for methane as a process material, first separated component 630 may be carbon and second separated component 632 may be $H_2$ gas (which recombined from atomic hydrogen $H^+$ before being collected at the outlet 603). Alternatively, first separated component 630 may be $CH_2$ and second separated component 632 may be hydrogen gas $H_2$. The separated component 632 is recycled back into the FEWG 605 through conduit 640, back to supply gas inlet 602. The recycled separated component 632 thus is used as a precursor gas 620. Although it is counterintuitive to return the produced separated components back into the reaction system, recycling of the components adds energy to the plasma, and in some embodiments can also contribute to thermal cracking of the process material since the recycled components have already been heated during the gas processing. In some embodiments, for example, separated component 632 can be 2-10 slm of $H_2$ that is recycled back into the FEWG 605, for a process in which a total of 150-200 slm of $H_2$ is produced. Other amounts or portions of separated component 632 may be recycled, as determined by factors such as the flow rate of the process material, and/or the amount of energy desired to be added to the process to initiate the targeted chemical pathways.

In some embodiments, some or all of the supply gas contains one or more recycled separated components of the process material. For example, the supply gas can be hydrogen, and the process material can be methane, which is reacted to form hydrogen and carbon, and at least a portion of the hydrogen that is produced from the methane can be recycled and used as the supply gas. Recycling the produced hydrogen beneficially improves the efficiency of the overall gas processing because the plasma formed from the hydrogen is highly efficient at cracking hydrocarbon bonds in the process material molecules. Additionally, in some embodiments, the recycled $H_2$ is already at a high temperature, and thus less energy input is need to achieve a thermal cracking energy. In some embodiments, the supply gas is $H_2$ provided by an external source, to which recycled $H_2$ is added. In such embodiments, the generated plasma is a hydrogen plasma.

Figure 7:
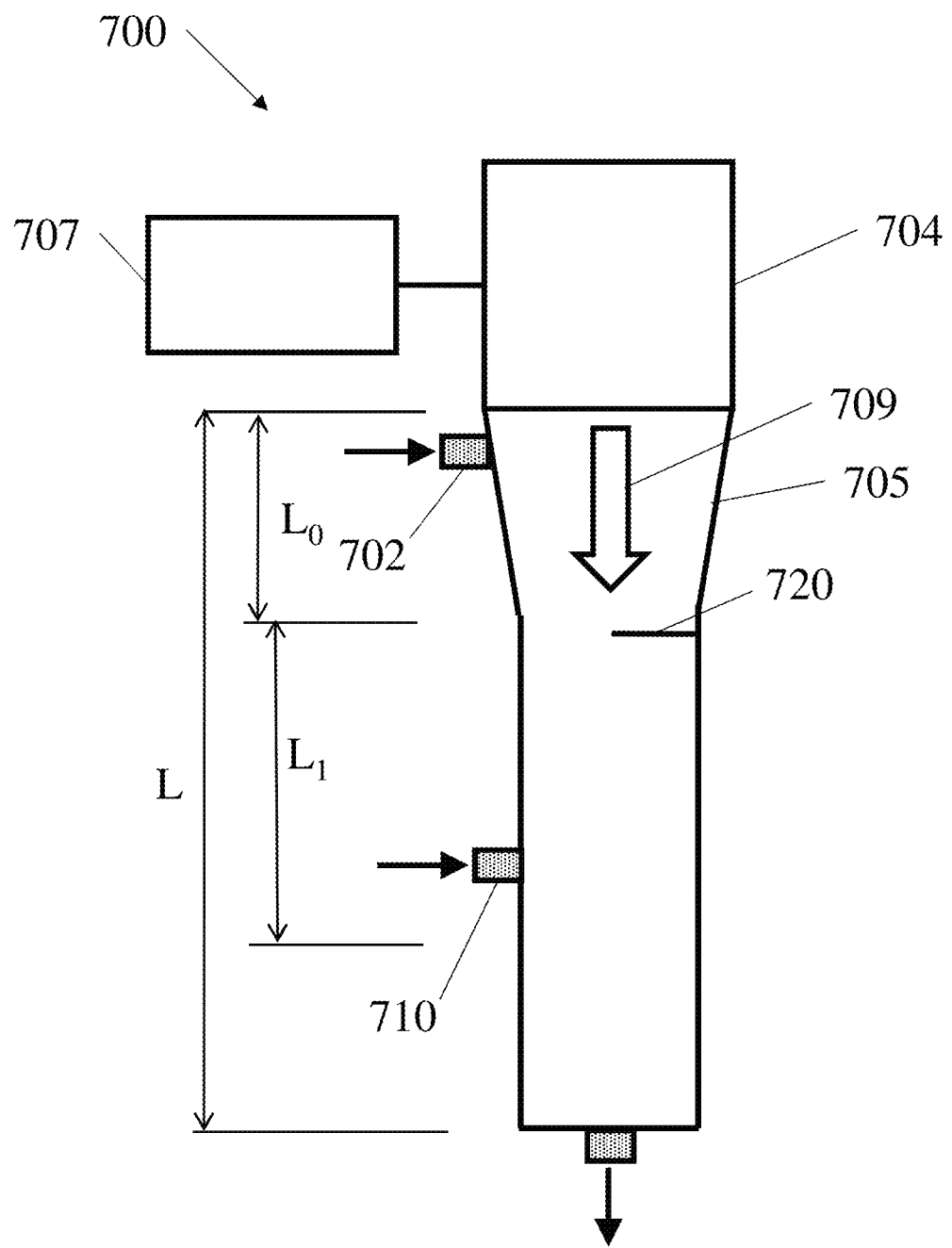
FIG. 7 is a simplified vertical cross-section of a microwave gas processing system having a filament, in accordance with embodiments of the present disclosure.

FIG. 7 illustrates a microwave process system with a FEWG and filaments. In the embodiment of FIG. 7, the microwave processing system 700 includes a microwave energy generator (i.e., a microwave energy source) 704, a FEWG 705, and a microwave emitter circuit 707 similar to previous embodiments. Microwave energy 709 is supplied by the microwave energy source 704, to propagate in a direction down the length L of the FEWG 705. In this embodiment, supply gas inlet 702 is placed near the entrance of the portion $L_0$, rather than at the entrance to the portion $L_1$ (i.e., the plasma zone) as was illustrated in previous embodiments. One or more metal filaments 720 is placed within the FEWG 705 to assist in the ignition of the plasma and/or the excitation of higher energy species within the plasma. In this embodiment, metal filament 720 is downstream of the first gas inlet 702, near the entrance to the plasma zone portion of the FEWG $L_1$ (with a smaller cross-sectional area than the FEWG closer to the microwave energy generator). In other embodiments, the filament 720 may be located at other locations within portion $L_1$ of the overall length L of the FEWG 705, where $L_1$ is the region in the waveguide where the plasma is formed as described in relation to previous embodiments. In some embodiments, the filament 720 is located within portion $L_1$ of the FEWG and upstream of the process material inlet 710, so that it will be located outside of the portion $L_2$ (i.e., length $L_2$ shown in FIG. 3) where reactions are taking place and which could coat the filament with reacted species. The presence of filament 720 can reduce the plasma ignition voltage by providing an ignition site, by focusing the electric field of microwave energy 709. Additionally, the filament 720 can become heated and emit electrons through thermionic emission, which further contributes to reducing the plasma ignition voltage. Although the filament 720 is illustrated as a single wire in this embodiment, filament 720 may take other configurations such as a coil or multiple filaments. In some embodiments, the filament 720 is tungsten. In some embodiments, the filament may be actively energized (powered) or may be passive. In some embodiments, the filament 720 is an osmium filament (e.g., configured as a plate, or coil, or other shape) adjacent to a heater coil. In some embodiments, the filament 720 is a ferrous material in the field of an inductive coil. In some embodiments, the filament 720 is actively heated where the active components (e.g., heating source components) are located outside of the waveguide 705 and the filament material that is being heated is inside of the waveguide 705.

Figure 8:
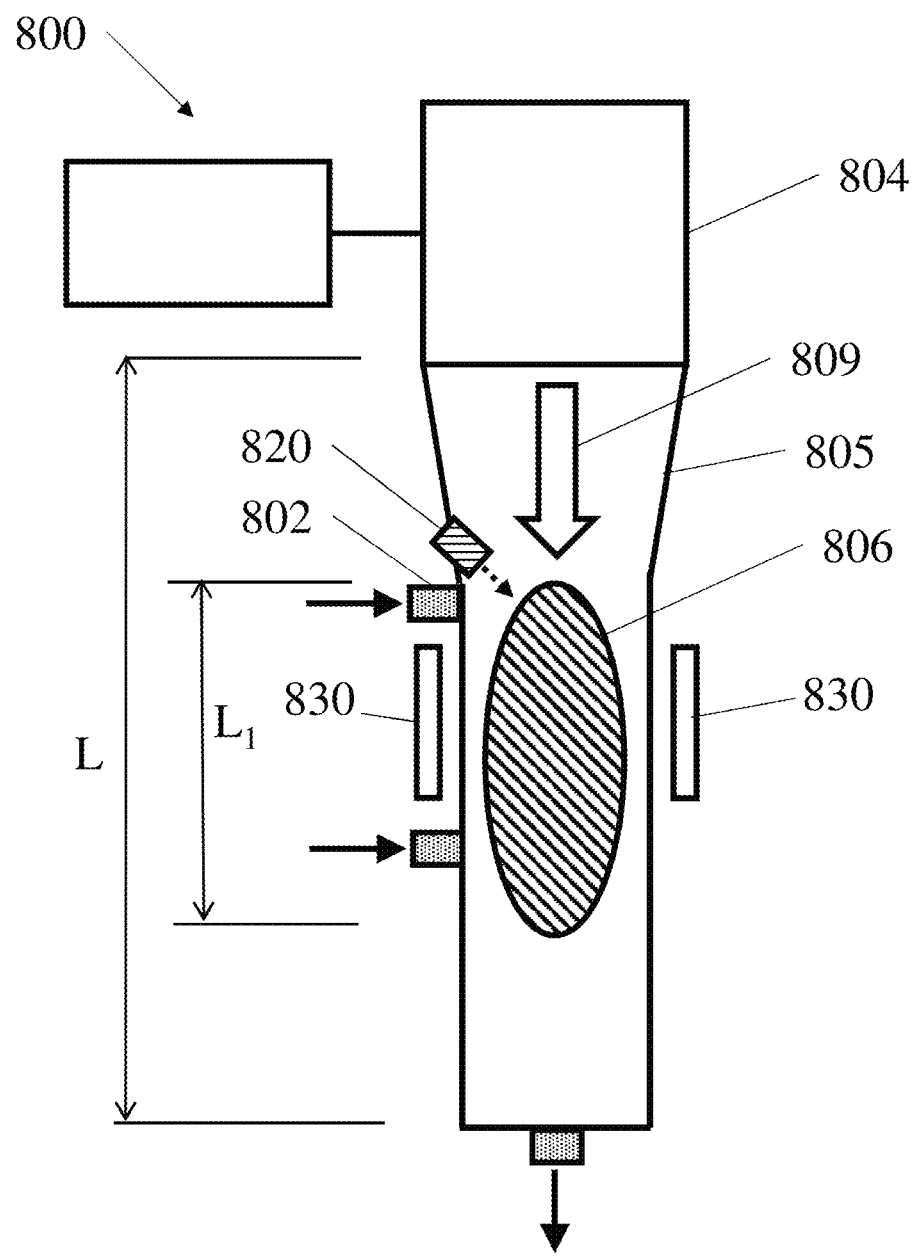
FIG. 8 is a simplified vertical cross-section of a microwave gas processing system in which an electron source and an electrode are depicted, in accordance with embodiments of the present disclosure.

FIG. 8 illustrates an embodiment of a microwave process system with a FEWG and an electron source. Microwave processing system 800 includes a supply gas inlet 802, a FEWG 805, and a microwave energy generator (i.e., microwave energy source) 804 that supplies microwave energy 809 as in previous embodiments. Microwave processing system 800 also includes one or more electron sources 820 to assist in the ignition of the plasma and/or the excitation of higher energy species within the plasma. The electron source 820 is configured to inject electrons into the FEWG 805, thereby decreasing the amount of initial energy needed to ignite the plasma. The ignition level of the plasma can therefore be controlled by controlling the amount of electrons present. In some embodiments, the electrons are injected into the portion $L_1$ of the overall length L of the FEWG 805, where $L_1$ is the region in the FEWG where the plasma is formed as described above. For example, in this embodiment the electron source 820 is configured to supply electrons into the FEWG 805 downstream of the first gas inlet 802. In some embodiments, the electron source 820 is a field emission source. In some embodiments, the electron source 820 contains an osmium element adjacent to a heater coil. In some embodiments, the electron source 820 contains a ferrous material in the field of an inductive coil. In some embodiments, the electron source 820 contains a filament, as described above, and the generated electrons are injected into the portion $L_1$ using a high voltage electric field. In some embodiments, the electron source 820 is alternatively a source of ions.

An advantage of using a filament 720 and/or an electron source 820 within the FEWG is that they enable a plasma to form quickly enough to keep up with fast microwave pulsing frequencies (e.g., at frequencies greater than 500 Hz, or greater than 1 kHz), even with high gas flows (e.g., greater than 5 slm) and large gas volumes (e.g., up to 1000 L). This is particularly important at high pressures (e.g., greater than 0.9 atm, or greater than 1 atm, or greater than 2 atm), because the high energy species will extinguish quickly in a high pressure atmosphere, and if the plasma cannot ignite fast enough, then there will be a low fraction of high-energy species (i.e., integrated over time) in a pulsed plasma at high pressures.

FIG. 8 also illustrates an embodiment of an electrode 830 in the present microwave process systems with FEWGs. The electrode 830 may be used independently of, or in combination with, the recycled precursor gases 620 of FIG. 6, the filaments 720 of FIG. 7, or the electron source 820 of FIG. 8. In some embodiments, the system 800 contains one or more sets of electrodes 830 to add energy to the plasma. The electrodes are configured to generate an electric field within the portion $L_1$ of the overall length L of the FEWG 805, where $L_1$ is the region in the FEWG where the plasma is formed as described above. Electrode 830 is embodied in FIG. 8 as a pair of substantially parallel electrodes of opposite charges, that are on the exterior of and on opposite sides of the portion of the FEWG 805 where the plasma 806 is generated. The electrodes can be energized to a particular voltage to accelerate the charged species within the plasma to a desired degree, thus controlling the plasma energy. The electrodes of this embodiment can be used with continuous wave microwave energy, but are particularly effective in combination with a pulsed microwave input. In conventional systems with electrodes and continuous microwave energy, the plasma between electrodes will localize (e.g., near the electrodes) at equilibrium and screen the electric field from the electrodes, which limits the ability of the electrodes to add energy to the plasma. However, when the microwaves are pulsed, the plasma will exist in the non-equilibrium state for a larger fraction of time and will screen the electric field of the electrodes for a smaller fraction of time.

In some embodiments, the microwave processing systems of the present disclosure will include magnets (not shown) to confine the plasma in the reaction zone and reduce the ignition voltage for generating the plasma. In some embodiments, the magnets are permanent or are electromagnets. The magnets can be positioned so the plasma density distribution can be controlled. In some embodiments, the magnets will increase the plasma density in the portion $L_1$, which will improve the efficiency by which the process material is separated by the plasma.

In some embodiments, the local impedance within the FEWG is tailored using filaments, point sources, electrodes and/or magnets. In some embodiments, filaments, point sources, electrodes and/or magnets are used to increase the density plasma within the reaction zone of the FEWG.

As previously described, microwave energy generators coupled to FEWGs containing reaction zones with the combination of pulsed microwave energy, high gas flows (e.g., greater than 5 slm), large volumes of plasma (e.g., up to 1000 L), high pressures (e.g., greater than 0.1 atm or greater than 0.9 atm, or greater than 2 atm), either filaments or electron sources to assist in plasma ignition at the start of each pulse, and/or electrodes to further add energy to the plasma can enable cost-effective high-productivity chemical gas processing systems, with low energy input requirements.

The microwave processing systems with the above features are configured in such a way that the plasma is generated and the process material is separated into components within the FEWG itself, such as the examples depicted in FIGS. 2, 3, 4A-4D, 5A-5B, 6, 7 and 8. In such systems, microwave energy enters the system upstream of the reaction generating the separated components, and therefore the problem of the separated components building up on a microwave entry window of a reactor and absorbing the microwave energy before it can generate the plasma is alleviated. In embodiments described herein, the portion of the FEWG where the separated components are generated acts as a reaction chamber, and the supply gas flow and/or the process material flow through the reaction chamber is parallel to the propagation direction of the microwave energy in the FEWG. The microwave energy enters the FEWG upstream of the portion of the FEWG acting as a reaction chamber where the separated components are generated.

In some embodiments, gas recycling, filaments, and electron sources can be used in microwave gas processing systems with FEWGs utilizing continuous wave (CW) microwave energy. In embodiments with CW microwave energy, gas recycling, filaments, and electron sources would still be advantageous to improve the gas processing efficiency of the system, reduce the ignition voltage of the plasma, and control the density distribution of the plasma.

In some embodiments, the separated components can adhere to the walls of the FEWG downstream of the reaction generating the separated components, despite the large volume of the reaction zone in the FEWG. Although this does not prevent the plasma from being generated, it still represents a loss of production and a source of contamination in the system. Therefore, in some embodiments, the gas flow of the supply gas and the process material can be designed to generate a plasma near the areas of deposition to remove the separated products that are deposited on the waveguide walls (or, reaction chamber walls). In some embodiments, additional inlets of supply gas and/or process material can be configured to direct the gases to the areas of deposition to remove the separated products that are deposited on the waveguide walls (or, reaction chamber walls).

Methods of Microwave Gas Processing

Figure 9:
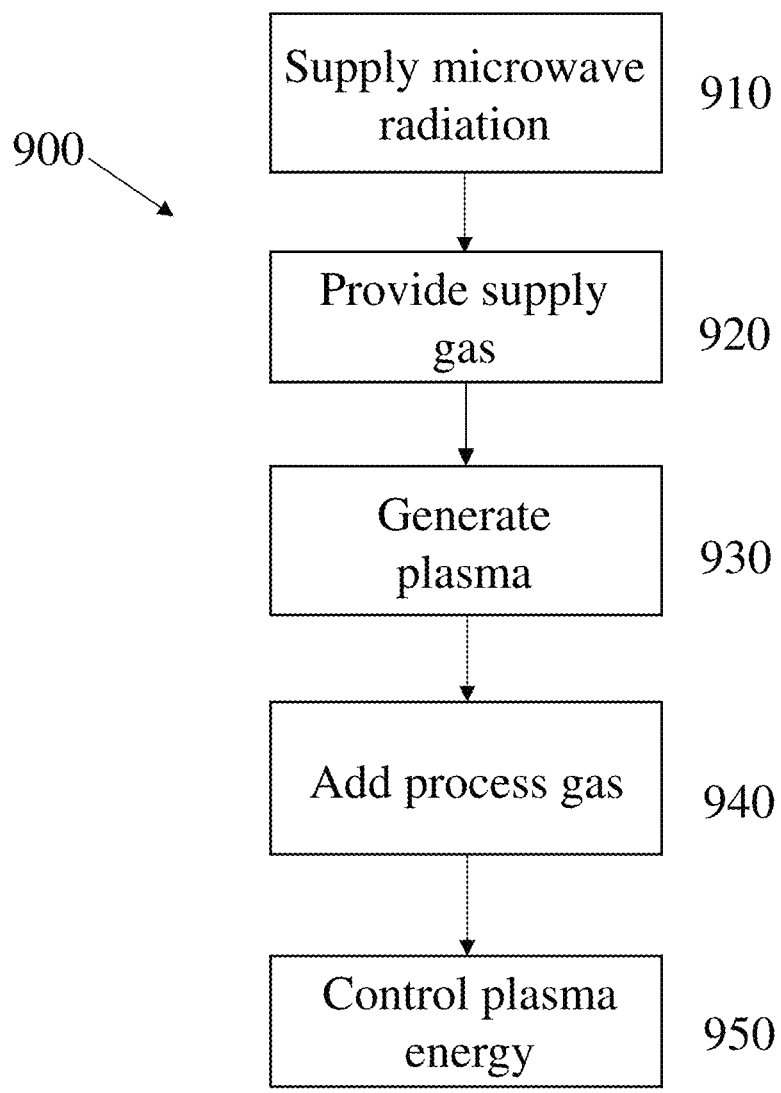
FIG. 9 is an example flow chart of methods for microwave processing of a gas in accordance with embodiments of the present disclosure.

FIG. 9 is an example flow chart 900 representing methods for microwave processing of gas, using chemistry control in high efficiency gas reactions with FEWGs. In step 910, microwave energy is supplied through a FEWG having a length, where the microwave energy propagates in a direction along the FEWG. The microwave energy may be pulsed or continuous wave. In some embodiments, the microwave energy is supplied into the FEWG with a time-average power less than 100 kW, or from 1 to 100 kW, or from 1 kW to 500 kW, or from 1 kW to 1 MW, or from 10 kW to 5 MW, or greater than 10 kW, or greater than 100 kW, or greater than 500 kW, or greater than 1 MW, or greater than 2 MW. In some embodiments, a pressure within the FEWG is at least 0.1 atmosphere, such as from 0.9 atm to 10 atm. In step 920, a supply gas is provided into the FEWG at a first location along the length of the FEWG, where a majority of the supply gas is flowing in the direction of the microwave energy propagation. In step 930, a plasma is generated in the supply gas in at least a portion of the length of the FEWG. A process material is added into the FEWG at step 940, at a second location downstream from the first location. In some embodiments, a majority of the process material flows in the direction of the microwave propagation at a flow rate of greater than 5 slm.

Optionally in step 950, an average energy of the plasma is controlled to convert the process material into separated components. The average energy may be, for example, 0.8 eV to 20 eV. In some embodiments, the pulsing frequency is controlled, where the pulsing frequency is greater than 500 Hz. For example, the pulsing frequency of the microwave energy may be from 500 Hz to 1000 kHz. In some embodiments, the duty cycle of the pulsed microwave energy is controlled in addition to or instead of the pulsing frequency, where the duty cycle is less than 50%.

Note that the steps in FIG. 9 may be performed in sequences other than what is shown. For example, the process gas 940 can be added at the same point as the process 920; that is, prior to the step of generating a plasma in step 930. In another example, controlling of the plasma energy in step 950 can be performed in conjunction with the generation of plasma in step 930.

In some embodiments, the process material is methane, and the separated components comprise hydrogen and a nanoparticulate carbon. For example, the nanoparticulate carbon can be include one or more forms of graphene, graphite, carbon nano-onions, fullerenes or nano-tubes.

In some embodiments, a precursor gas is added to the supply gas at the first location, the precursor gas comprising hydrogen or a noble gas. In some embodiments, the separated components comprise $H_2$, and at least a portion of the separated component $H_2$ is recycled back to the first location. In such embodiments, the supply gas comprises $H_2$, and the plasma comprises a hydrogen plasma.

In various embodiments, the methods include providing a metal filament in the FEWG, the metal filament serving to reduce an ignition voltage for generating the plasma. In various embodiments, the methods include providing a pair of electrodes to the system, wherein the electrodes are configured to add energy to the generated plasma in the FEWG.

Example

Figure 10A:
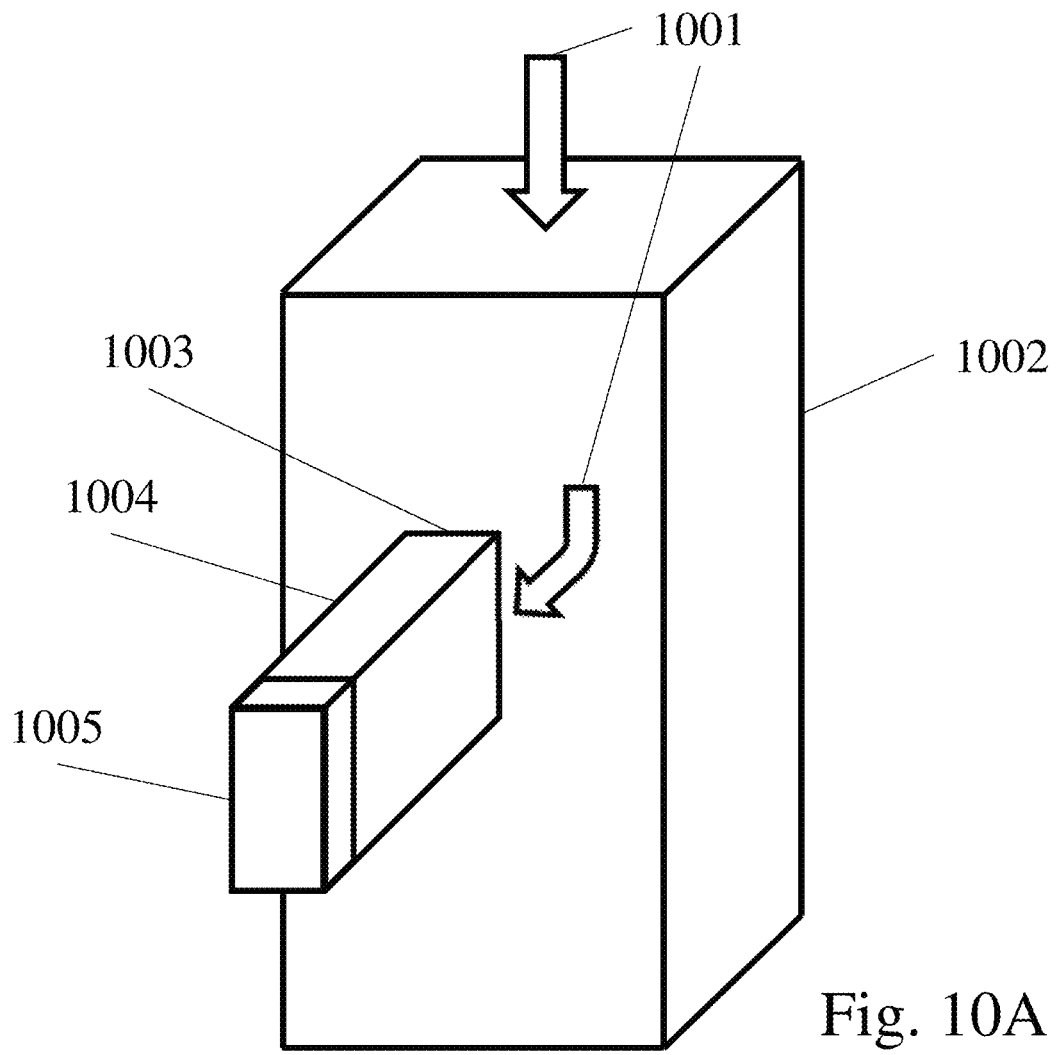
FIGS. 10A-10B show a test system used in demonstrating the concept of generating a plasma and reaction zone with in a waveguide.
Figure 10B:
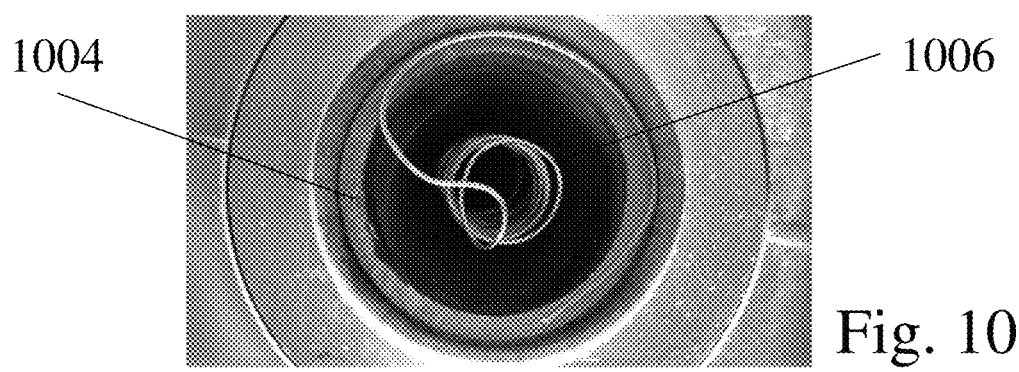

The concept of generating a plasma and a reaction zone within a waveguide was demonstrated on a test system shown in the simplified isometric diagram of FIG. 10A and the photo of 10B. The system of FIGS. 10A and 10B included microwave energy 1001 entering a waveguide 1002, and plasma being generated in a reaction chamber portion of the waveguide 1004 that is coupled to the waveguide 1002. The field-enhancing portion of the waveguide in the demonstrated system comprised an abrupt change in cross-sectional area 1003 rather than a tapered change as described in previous embodiments. The reaction zone portion of the waveguide in this example had a circular cross-section as shown in the interior plan view of FIG. 10B. As shown in FIG. 10B, the reaction zone of the waveguide 1004 also contained a filament 1006 to further enhance the field in the reaction zone. The filament in this example was made from tantalum, titanium or tungsten and served to concentrate the electric field of the microwave energy, which increased the plasma density in the reaction zone and aided in the reaction to separate the process material into separated components.

In this example, the microwave power entering the waveguide 1002 was from 1 kW to 1.5 kW. The supply gas in this example was hydrogen with various percentages of argon introduced into the waveguide 1002 at a flow rate from 0.1 to 1 slm, and the process gas was methane introduced into the waveguide 1002 at a flow rate from 0.1 to 2 slm. The separated components in this example were particulates of carbon allotropes, and hydrogen gas, and were collected at the outlet 1005.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those of ordinary skill in the art, without departing from the scope of the present invention. Furthermore, those of ordinary skill in the art will appreciate that the foregoing description is by way of example only, and is not intended to limit the invention.

What is claimed is:

1. A reactor system comprising:
a microwave energy source configured to generate a microwave energy;
a field-enhancing waveguide (FEWG) serving as a reaction chamber and coupled to the microwave energy source, the FEWG comprising:
a first cross-sectional area and a second cross-sectional area, the second cross-sectional area farther away from the microwave energy source than the first cross sectional area;
a field-enhancing zone disposed between the first cross-sectional area and the second cross-sectional area and having a cross-sectional area that decreases along a length of the FEWG, the FEWG further comprising:
a supply gas inlet configured to receive a supply gas;
a reaction zone disposed downstream of the supply gas inlet, along the length of the FEWG and configured to generate a plasma in response to excitation of the supply gas by the microwave energy; and a process inlet located downstream from the supply gas inlet and configured to inject a raw material into the reaction zone;

a pair of electrodes positioned outside on opposite sides of the FEWG proximate to the reaction zone, the pair of electrodes configured to generate an electric field through which the plasma and the raw material are combined; and an outlet configured to output a carbon structure resulting from the combination of the plasma and the raw material.

2. The reactor system of claim 1, wherein the process inlet is positioned proximate to the plasma.

3. The reactor system of claim 1, where the reaction zone has a pressure of at least approximately 0.1 atmosphere.

4. The reactor system of claim 1, wherein the supply gas comprises hydrogen, helium or a noble gas.

5. The reactor system of claim 1, wherein a shape of the FEWG is defined by one or more walls.

6. The reactor system of claim 1, wherein the process inlet is configured to flow the raw material at a flow rate of greater than approximately 5 standard liters per minute (slm) into the reaction zone.

7. The reactor system of claim 1, wherein the raw material further comprises a gas, a liquid, or a colloidal dispersion.

8. The reactor system of claim 1, wherein the pair of electrodes is configured to generate an electric field within the FEWG.

9. The reactor system of claim 1, wherein the pair of electrodes at least partially surrounds the FEWG.

10. The reactor system of claim 1, wherein the supply gas is at least partially consumed to generate the plasma.

11. The reactor system of claim 1, wherein the microwave energy source is configured to adjust one or more of a pulsing frequency, a pulsing duty cycle, a pulsing shape, or an output power level of the microwave energy.

12. The reactor system of claim 1, wherein the raw material further comprises any one or more of carbonaceous particles, colloidal dispersions, or a plurality of solid particles.

13. The reactor system of claim 12, wherein the plurality of solid particles is configured to be mixed with any one or more of liquid forms of water, alkanes, alkenes, alkynes, aromatic hydrocarbons, saturated hydrocarbons, or unsaturated hydrocarbons.

14. The reactor system of claim 1, wherein the raw material further comprises any one or more of solid inorganic materials coated in organic materials, silicon coated with graphene, composite materials having interlayers of organic or inorganic materials, or a silicon core having a layer of carbon encapsulating the silicon core.

15. The reactor system of claim 1, wherein the raw material further comprises any one or more of sulfur, $SiH_4$, trimethylaluminum, trimethylgallium, or glycidyl methacrylate.

16. The reactor system of claim 1, wherein the plasma is configured to convert the raw material into separated components in the reaction zone.

* * * * *